United States Patent
Lee et al.

(10) Patent No.: US 8,274,829 B2
(45) Date of Patent: Sep. 25, 2012

(54) ROW-DECODER AND SOURCE-DECODER STRUCTURES SUITABLE FOR ERASE IN UNIT OF PAGE, SECTOR AND CHIP OF A NOR-TYPE FLASH OPERATING BELOW +/− 10V BVDS

(75) Inventors: Peter Wung Lee, Saratoga, CA (US); Fu-Chang Hsu, San Jose, CA (US); Hsing-Ya Tsao, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 547 days.

(21) Appl. No.: 12/455,936

(22) Filed: Jun. 9, 2009

(65) Prior Publication Data

US 2009/0310411 A1    Dec. 17, 2009

Related U.S. Application Data

(60) Provisional application No. 61/131,554, filed on Jun. 9, 2008, provisional application No. 61/132,122, filed on Jun. 16, 2008, provisional application No. 61/132,628, filed on Jun. 20, 2008.

(51) Int. Cl.
   G11C 11/34   (2006.01)
   G11C 11/4193   (2006.01)
(52) U.S. Cl. ......... 365/185.18; 365/185.02; 365/185.27; 365/185.29
(58) Field of Classification Search ............. 365/185.02, 365/185.18, 185.27, 185.29
See application file for complete search history.

(56) References Cited

U.S. PATENT DOCUMENTS

| | | | | | |
|---|---|---|---|---|---|
| 5,587,947 | A | * | 12/1996 | Chang et al. | 365/185.3 |
| 5,898,606 | A | * | 4/1999 | Kobayashi et al. | 365/63 |
| 5,901,090 | A | | 5/1999 | Haddad et al. | |
| 6,023,188 | A | * | 2/2000 | Lee et al. | 327/536 |
| 6,134,150 | A | * | 10/2000 | Hsu et al. | 365/185.29 |

(Continued)

FOREIGN PATENT DOCUMENTS

WO PCT/US2009/003472    7/2009

OTHER PUBLICATIONS

"Electrical Switching and Memory Behaviors in Organic-Based Devices," PhD dissertation, University of Texas. Published Aug. 2009, by Chia-Hsun Tu, [retrieved on Jul. 17, 2009 from the Internet<URL: http://www.lib.utexas.edu/etd/d/2008/tud57914/tud57914.pdf>.

(Continued)

*Primary Examiner* — Huan Hoang
*Assistant Examiner* — Jay Radke
(74) *Attorney, Agent, or Firm* — Saile Ackerman LLC; Stephen B. Ackerman; Billy Knowles

(57) ABSTRACT

An apparatus and method for operating an array of NOR connected flash nonvolatile memory cells erases the array in increments of a page, block, sector, or the entire array while minimizing operational disturbances and providing bias operating conditions to prevent gate to source breakdown in peripheral devices. The apparatus has a row decoder circuit and a source decoder circuit for selecting the nonvolatile memory cells for providing biasing conditions for reading, programming, verifying, and erasing the selected nonvolatile memory cells while minimizing operational disturbances and preventing gate to source breakdown in peripheral devices.

93 Claims, 18 Drawing Sheets

U.S. PATENT DOCUMENTS

| | | | |
|---|---|---|---|
| 6,510,085 | B1 | 1/2003 | Fastow et al. |
| 6,587,375 | B2* | 7/2003 | Chung et al. ............ 365/185.13 |
| 6,620,682 | B1 | 9/2003 | Lee et al. |
| 6,628,563 | B1 | 9/2003 | Hsu et al. |
| 6,777,292 | B2 | 8/2004 | Lee et al. |
| 6,807,103 | B2 | 10/2004 | Cavaleri et al. |
| 6,818,491 | B2 | 11/2004 | Lee et al. |
| 7,042,767 | B2 | 5/2006 | Wang et al. |
| 2001/0020840 | A1* | 9/2001 | Kojima ........................ 323/282 |
| 2002/0097603 | A1 | 7/2002 | Tanaka et al. |
| 2004/0125653 | A1 | 7/2004 | Tran et al. |
| 2004/0155234 | A1* | 8/2004 | Ishimaru et al. ................ 257/10 |
| 2005/0122776 | A1* | 6/2005 | Lee et al. ................. 365/185.11 |
| 2005/0248993 | A1* | 11/2005 | Lee et al. ................. 365/185.29 |
| 2006/0262603 | A1* | 11/2006 | La Rosa ................... 365/185.23 |
| 2006/0262605 | A1 | 11/2006 | Seki et al. |
| 2008/0080242 | A1* | 4/2008 | Wang ....................... 365/185.11 |

OTHER PUBLICATIONS

Co-pending, U.S. Appl. No. 12/387,771, filed May 7, 2009, "A NAND Based NMOS NOR Flash Memory Cell, a NAND Based NMOS NOR Flash Memory Array, and a Method of Forming a NAND Based NMOS NOR Flash Memory Array," assigned to the same assignees as the present invention.

Co-pending, U.S. Appl. No. 12/455,337, filed Jun. 1, 2009, "A NAND String BAsed NAND/NOR Flash Memory Cell, Array, and Memory Device Having Parallel Bit Lines and Source Lines, having a Programmable Select GAting Transistor, and Circuits and Methods for Operating Same," assigned to the same assignee as the present invention.

Co-pending, U.S. Appl. No. 12/456,354, filed Jun. 16, 2009, "Row-Decoder and Select Gate Decoder Structures Suitable for Flashed-Based EEPROM Operating Below +/−10V BVDS," assigned to the same assignee as the present invention.

Co-pending, U.S. Appl. No. 12/456,744, filed Jun. 22, 2009, "An Apparatus and Method for Inhibiting Excess Leakage Current in Unselected Nonvolatile Memory Cells in an Array," assigned to the same assignee as the present invention.

* cited by examiner

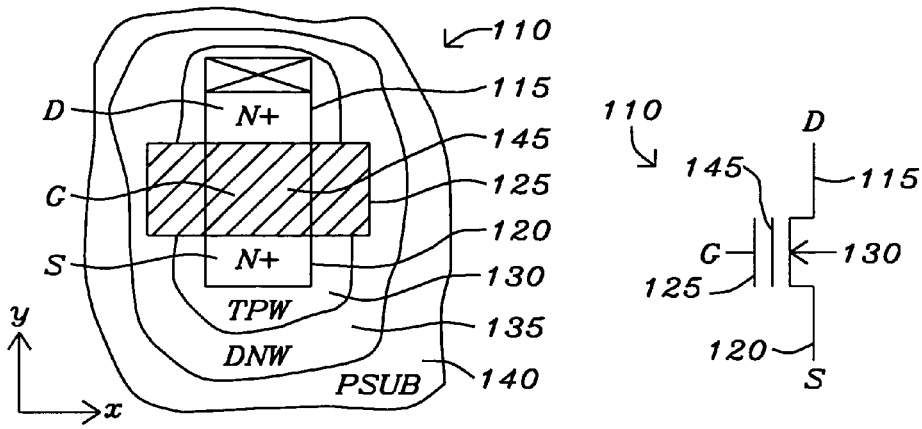
FIG. 1a  FIG. 1c
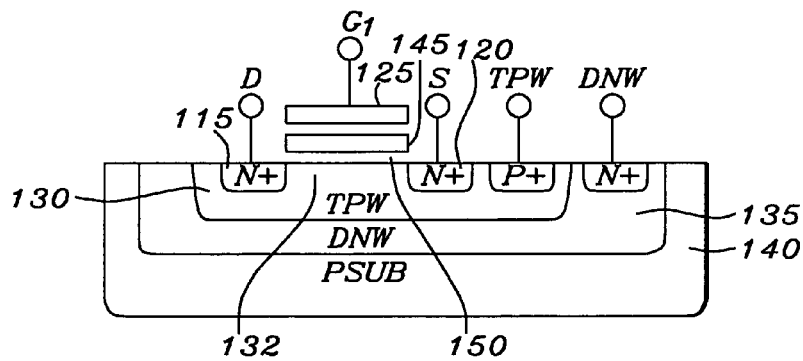
FIG. 1b
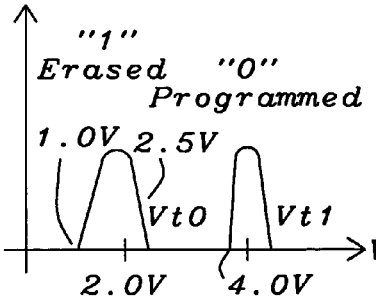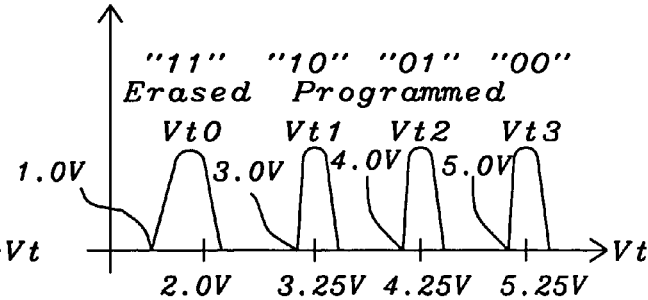
FIG. 1d  FIG. 1e

| | WL (Unsel BLK: 412u) | WL (Sel BLK:) 432u | | LBL (Sel Sec) 412s | | | BLC (Sel Sec) | | SL[N] (Sel Sec) | | SLC (Sel Sec) | | TPW | |
|---|---|---|---|---|---|---|---|---|---|---|---|---|---|---|
| | | SEL 432s | UNSEL 432su | SEL 450s | UNSEL 450u | | SEL 433s | UNSEL 433u | SEL 426s | UNSEL 426u | SEL 467s | UNSEL 467u | SEL 244s | UNSEL 244u |
| READ+ | 0V | VDD | 0V | 1V | 0V | | HV" | HV" | 0V | 1V | VDD | 0V | 0V | 0V |
| PAGE ERASE | -10V! | 10V | 0V* | -10V | -10V | | 0V | 0V | -10V | -10V | -10V | -10V | -10V | 0V |
| PAGE ERASE VERIFY | 0V | Vt1L | 0V | Vdd-Vt /0V | 0V | | HV" | HV" | 0V | 1V | VDD | VDD | 0V | 0V |
| BLOCK ERASE | -10V! | 10V | NA | -10V | -10V | | 0V | 0V | -10V | -10V | -10V | -10V | -10V | 0V |
| BLOCK ERASE VERIFY | 0V | Vt1L | NA | Vdd-Vt /0V | 0V | | HV" | HV" | 0V | 1V | VDD | VDD | 0V | 0V |
| SECTOR ERASE | NA | 10V | NA | -10V | NA | | 0V | NA | -10V | NA | -10V | -10V | -10V | 0V |
| SECTOR ERASE VERIFY | NA | Vdd-Vt /0V | NA | Vdd-Vt /0V | NA | | HV" | NA | 0V | NA | VDD | VDD | 0V | 0V |
| PAGE PROGRAM | -2V | -10V | -2V | 5.0V/ 0.0V | 0V | | 10V | 0V | 0V | 1.5V- 1.8V | 10V | -10V | 0V | 0V |
| PAGE PROGRAM VERIFY | 0V | VtOH | 0V | Vdd-Vt /0V | 0V | | HV" | HV" | 0V | 1V | VDD | 0V | 0V | 0V |

LEGEND
-10V! : Coupled from NOR Array's TPW
0V* : Coupled from NOR Array's TPW
HV" : HV~=5V
NA = Not Applicable

FIG. 13a

| | WL (Unsel) BLK: 412u | WL (Sel BLK:) 412s | | LBL (Sel Sec) 410s | | BLC (Sel Sec) 410s | | SL[N] (Sel Sec) 410s | | SLC (Sel Sec) 410s | | TPW | |
|---|---|---|---|---|---|---|---|---|---|---|---|---|---|
| | 432u | SEL 432s | UNSEL 432su | SEL 450s | UNSEL 450u | SEL 433s | UNSEL 433u | SEL 426s | UNSEL 426u | SEL 467s | UNSEL 467u | SEL 244s | UNSEL 244u |
| READ | 0V | HV" | 0V | 1V | 0V | HV" | HV" | 0V | 1V | VDD | 0V | 0V | 0V |
| PAGE ERASE | -10V! | 10V | 0V* | -10V | -10V | 0V | 0V | -10V | -10V | -10V | -10V | -10V | 0V |
| PAGE ERASE VERIFY | 0V | Vt3L | 0V | Vdd-Vt/0V | 0V | HV" | 0V | 0V | 1V | VDD | VDD | 0V | 0V |
| BLOCK ERASE | -10V! | 10V | NA | -10V | -10V | 0V | 0V | -10V | -10V | -10V | -10V | -10V | 0V |
| BLOCK ERASE VERIFY | 0V | Vt3L | NA | Vdd-Vt/0V | 0V | HV" | 0V | 0V | 1V | VDD | VDD | 0V | 0V |
| SECTOR ERASE | NA | 10V | NA | -10V | NA | 0V | NA | -10V | NA | -10V | NA | -10V | 0V |
| SECTOR ERASE VERIFY | NA | Vt3L | NA | Vdd-Vt/0V | NA | 0V | NA | 0V | NA | VDD | NA | 0V | 0V |
| PAGE PROGRAM | -2V | -10V | -2V | 4V/5V/6V/0V | 0V | 10V | 0V | 0V | 1.5V-1.8V | 10V | 0V | 0V | 0V |
| PAGE PROGRAM VERIFY | 0V | VtOH/Vt1H | 0V | Vdd-Vt/0V | 0V | HV" | HV" | 0V | 1V | VDD | 0V | 0V | 0V |

LEGEND
-10V! : Coupled from NOR Array's TPW
0V* : Coupled from NOR Array's TPW
HV"; HV"=5V
NA = Not Applicable

FIG. 13b

| | WL (Sel Blk) Sel 432s | WL (Sel Blk) Unsel 432su | WL (Unsel BLK) 432u | XT Sel 535s | XT Unsel 535u | XD Sel 530s | XD Unsel 530u | NW Sel 552s | NW Unsel 552u | ISOB 566 | RDB 564 | VPX0 527b | VNX0 526a | VP1 562 | VN1 560 | VPX1 527a | VNX1 526b | ISOP 528 |
|---|---|---|---|---|---|---|---|---|---|---|---|---|---|---|---|---|---|---|
| READ | VDD | 0V | 0V | VDD | VDD | VDD | 0V | VDD | VDD | -5V | 0V | VDD | 0V | VDD | VDD | VDD | 0V | 0V |
| PAGE ERASE | 10V | 0V* | -10V! | 10V | 0V | 10V | 0V | 10V | 0V | 0V | 10V | 10V | 0V | 10V | 0V | 10V | 0V | 0V |
| PAGE ERASE VERIFY | Vt1L | 0V | 0V | Vt1L | 0V | Vt1L | 0V | Vt1L | Vt1L | -5V | 0V | Vt1L | 0V | Vt1L | 0V | Vt1L | 0V | 0V |
| BLOCK ERASE | 10V | NA | 0V | 10V | 0V | 10V | 0V | 10V | 0V | 0V | 10V | 10V | 0V | 10V | 0V | 10V | 0V | 0V |
| BLOCK ERASE VERIFY | Vt1L | NA | 0V | Vt1L | 0V | Vt1L | 0V | Vt1L | Vt1L | -5V | 0V | Vt1L | 0V | Vt1L | 0V | Vt1L | 0V | 0V |
| SECTOR ERASE | 10V | NA | NA | 10V | NA | 10V | NA | 10V | NA | -5V | 0V | 10V | -5V | 10V | 0V | 10V | 0V | 0V |
| SECTOR ERASE VERIFY | Vt1L | NA | NA | Vt1L | NA | Vt1L | NA | Vt1L | Vt1L | -5V | 0V | Vt1L | 0V | Vt1L | 0V | Vt1L | 0V | 0V |
| PAGE PROGRAM | -10V | -2V | -2V | -10V | -2V | 0V | -10V | 0V | 0V | -12V | -10V | VDD | 0V | 0V | 0V | 0V | -10V | -5V |
| PAGE PROGRAM VERIFY | VtOH | 0V | 0V | VtOH | 0V | VDD | 0V | VDD | VDD | -5V | 0V | VDD | 0V | VDD | VDD | VDD | 0V | 0V |

LEGEND
0V* : Coupled from NOR Array's TPW
-10V! : Coupled from NOR Array's TPW

FIG. 14a

| | WL (Sel BLK) 432s | WL (Unsel BLK) 432su | XT Sel 535s | XT Unsel 535u | XD Sel 530s | XD Unsel 530u | NW Sel 552s | NW Unsel 552u | ISOB 566 | RDB 564 | VPX0 527b | VNX0 526a | VP1 562 | VN1 560 | VPX1 527a | VNX1 526b | ISOP 528 |
|---|---|---|---|---|---|---|---|---|---|---|---|---|---|---|---|---|---|
| READ | HV'' | 0V | HV'' | 0V | HV'' | 0V | HV'' | HV'' | −5V | 0V | HV'' | 0V | HV'' | HV'' | HV'' | 0V | 0V |
| PAGE ERASE | 10V | 0V* | 10V | 0V | 10V | 0V | 10V | 0V | 0V | 10V | 10V | 0V | 10V | 0V | 10V | 0V | 0V |
| PAGE ERASE VERIFY | Vt3L | 0V | Vt3L | 0V | HV'' | 0V | HV'' | HV'' | −5V | 0V | HV'' | 0V | HV'' | 0V | HV'' | 0V | 0V |
| BLOCK ERASE | 10V | NA | 10V | NA | 10V | NA | 10V | HV'' | 0V | 10V | 10V | 0V | 10V | 0V | 10V | 0V | 0V |
| BLOCK ERASE VERIFY | Vt3L | NA | Vt3L | NA | HV'' | NA | HV'' | HV'' | −5V | 0V | HV'' | 0V | HV'' | 0V | HV'' | 0V | 0V |
| SECTOR ERASE | 10V | NA | 10V | NA | 10V | NA | 10V | 10V | 0V | 10V | 10V | 0V | 10V | 0V | 10V | 0V | 0V |
| SECTOR ERASE VERIFY | Vt3L | NA | Vt3L | NA | HV'' | NA | NA | NA | −5V | 0V | HV'' | 0V | HV'' | 0V | HV'' | 0V | 0V |
| PAGE PROGRAM | −10V | −2V | −10V | −2V | 0V | −10V | 0V | 0V | −12V | −10V | VDD | 0V | 0V | 0V | 0V | −10V | −5V |
| PAGE PROGRAM VERIFY | Vt0H/Vt1H/Vt2H | 0V | Vt0H/Vt1H/Vt2H | 0V | HV''' | 0V | HV''' | HV''' | −5V | 0V | HV''' | 0V | HV''' | HV''' | HV''' | 0V | 0V |

LEGEND
0V*: Coupled from NOR Array's TPW
−10V!: Coupled from NOR Array's TPW
HV''':HV~−5V

FIG. 14b

| | SL (Sel BLK) | | SL (Unsel BLK) 412s 426u | ST | | SXD | | BLG | | ERSB | VP2 | SLS | DISE | PG | PGB |
|---|---|---|---|---|---|---|---|---|---|---|---|---|---|---|---|
| | Sel 426s | Unsel 426u | | Sel 620s | Unsel 620u | Sel 610s | Unsel 610u | Sel 433s | Unsel 433u | 615 | 616 | 632 | 630 | 618 | 619 |
| READ | 0V | VS1* | VS1* | 0V | VS1* | VDD | 0V | HV" | 0V | VDD | HV" | VS1* | VDD | 0V | HV" |
| PAGE/BLOCK/SECTOR ERASE | -10V | -10V | -10V | 0V | NA | VDD | 0V | HV" | 0V | 0V | 0V | -10V | -10V | 0V | VDD |
| PAGE/BLOCK/SECTOR ERASE VERIFY | 0V | VS1* | VS1* | 0V | VS1* | VDD | 0V | HV" | 0V | VDD | HV" | VS1* | VDD | 0V | HV" |
| PAGE PROGRAM | 0V | VS2** | VS2** | 0V | VS2** | VDD | 0V | 10V | 0V | VDD | 10V | VS2** | HV" | 10V | 0V |
| PAGE PROGRAM VERIFY | 0V | VS1* | VS1* | 0V | VS1* | VDD | 0V | HV" | 0V | VDD | HV" | VS1* | VDD | 0V | HV" |

LEGEND
HV": HV ~ 5V
VS1*: Vs1 ~ 1V
VS2**: VS2 ~ 1.5V ~ 1.8V

FIG. 15

ROW-DECODER AND SOURCE-DECODER STRUCTURES SUITABLE FOR ERASE IN UNIT OF PAGE, SECTOR AND CHIP OF A NOR-TYPE FLASH OPERATING BELOW +/− 10V BVDS

This application claims priority under 35 U.S.C. §119 to U.S. Provisional Patent Application Ser. No. 61/131,554, filed on Jun. 9, 2008, which is herein incorporated by reference in its entirety.

This application claims priority under 35 U.S.C. §119 to U.S. Patent Application Ser. No. 61/132,122, filed on Jun. 16, 2008, assigned to the same assignee as the present invention, and incorporated herein by reference in its entirety.

This application claims priority under 35 U.S.C. §119 to U.S. Patent Application Ser. No. 61/132,628, filed on Jun. 20, 2008, assigned to the same assignee as the present invention, and incorporated herein by reference in its entirety.

RELATED PATENT APPLICATIONS

U.S. patent application Ser. No. 12/387,771, filed May 7, 2009.
U.S. patent application Ser. No. 12/455,337, filed Jun. 1, 2009.
U.S. patent application Ser. No. 12/456,354, filed Jun. 16, 2009.
U.S. patent application Ser. No. 12/456,744, filed Jun. 22, 2009.

BACKGROUND OF THE INVENTION

1. Field of the Invention

This invention relates generally to nonvolatile memory array structure and operation. More particularly, this invention relates to NOR nonvolatile memory device structures, peripheral circuits for NOR nonvolatile memory devices and methods for operation of NOR nonvolatile memory devices.

2. Description of Related Art

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular types of Nonvolatile Memory. Flash Memory has the combined advantages of the high density, small silicon area, low cost, and can be repeatedly programmed and erased with a single low-voltage power supply voltage source.

The Flash Memory structures known in the art employ a charge retaining mechanism such as a charge storage phenomena and a charge trapping phenomena. In the charge storage mechanism, as with a floating gate nonvolatile memory, the charge representing digital data is stored on a floating gate of the device. The stored charge modifies the threshold voltage of the floating gate memory cell to determine the digital data stored. In a charge trapping mechanism, as in a Silicon-Oxide-Nitride Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such as Silicon Nitride ($SiN_x$).

A present day flash nonvolatile memory is divided into two major product categories such as the fast random-access asynchronous NOR flash nonvolatile memory and the slower serial-access synchronous NAND flash nonvolatile memory. NOR flash nonvolatile memory devices, as presently designed are the high pin-count memory with multiple external address and data pins along with appropriate control signal pins. One disadvantage of NOR flash nonvolatile memory is, as the density is doubled, the number of the required external pin count increases by one due to the adding of one more external address pin. In contrast, NAND flash nonvolatile memory has an advantage of having a smaller pin-count than NOR with no address input pins. As density increases, the NAND flash nonvolatile memory pin count is always kept constant. Both main-streamed NAND and NOR flash nonvolatile memory cell structures in production today use a one charge retaining (charge storage or charge trapping) transistor memory cell that stores one bit of data as charge or as it commonly referred to as a single-level program cell (SLC). They are respectively referred as one-bit/one transistor NAND cell or NOR cell, storing a single-level programmed data in the cell.

The NAND and NOR flash nonvolatile memory provide the advantage of in-system program and erase capabilities and have a specification for providing at least 100K endurance cycles. In addition, both single-chip NAND and NOR flash nonvolatile memory product can provide giga-byte density because their highly-scalable cell sizes. For instance, presently a one-bit/one transistor NAND cell size is kept at ~$4\lambda^2$ ($\lambda$ being a minimum feature size in a semiconductor process), while NOR cell size is ~$10\lambda^2$. Furthermore, in addition to storing data as a single-level program cell having two voltage thresholds (Vt0 and Vt1), both one transistor NAND and NOR flash nonvolatile memory cells are able to store at least two bits per cell or two bits/one transistor with four multi-level threshold voltages (Vt0, Vt1, Vt2 and Vt03) in one physical cell.

NOR flash memories cells are arranged in an array, of rows and columns in a NOR-like structure. All the NOR Flash cells on each row share the same word line. The drain electrodes that are common to two cells on each column are commonly connected to the bit line (BL) associated with each column. Sources of each of the NOR flash cells of each of the rows of the array are commonly connected to the source lines SL that are commonly connected and are often connected to the ground reference voltage source.

Currently, the highest-capacity of a single-chip double polycrystalline silicon gate NAND flash nonvolatile memory chip is 64 Gb. In contrast, a double polycrystalline silicon gate NOR flash nonvolatile memory chip has a density of 2 Gb. The big gap between NAND and NOR flash nonvolatile memory density is a result of the superior scalability of NAND flash nonvolatile memory cell over a NOR flash nonvolatile memory. A NOR flash nonvolatile memory cell requires 5.0V drain-to source (Vds) to maintain a high-current Channel-Hot-Electron (CHE) programming process. Alternately, a NAND flash nonvolatile memory cell requires a voltage difference between the drain to source of zero volts (0.0V) for a low-current Fowler Nordheim channel tunneling program process. This results in the one-bit/one transistor NAND flash nonvolatile memory cell size being approximately one-half that of a one bit/one transistor NOR flash nonvolatile memory cell. This permits a NAND flash nonvolatile memory device to be used in applications that require huge data storage. A NOR flash nonvolatile memory device is extensively used as a program-code storage memory which requires less data storage and requires fast and asynchronous random access.

SUMMARY OF THE INVENTION

An object of this invention is to provide a method for operating an array of NOR connected flash nonvolatile memory cells at increments of a page, block, sector, or an entire array while minimizing operational disturbances and providing bias operating conditions to prevent drain to source breakdown in peripheral devices.

Another object of this invention is to provide a row decoder circuit for selecting nonvolatile memory cells of an array of NOR connected nonvolatile memory cells for providing biasing conditions for reading, programming, verifying, and erasing the selected nonvolatile memory cells of the array of the NOR connected nonvolatile memory cells while minimizing operational disturbances and preventing drain to source breakdown in peripheral devices.

Further, another object of this invention is to provide a source decoder circuit for selecting and providing biasing conditions to selected nonvolatile memory cells of an array of NOR connected nonvolatile memory cells for reading, programming, verifying, and erasing the selected nonvolatile memory cells of the array of the NOR connected nonvolatile memory cells while minimizing operational disturbances and preventing drain to source breakdown of peripheral devices.

To accomplish at least one of these objects, a nonvolatile memory device includes an array of nonvolatile memory cells arranged in rows and columns. The nonvolatile memory cells are connected into a NOR configuration where the nonvolatile memory cells located on each column are connected such that the drains of each of the nonvolatile memory cells are commonly connected to a local bit line associated with each column. The nonvolatile memory cells on each row have their gates commonly connected to a word line. The nonvolatile memory cells on two adjacent rows have their sources commonly connected to a source line. The array of nonvolatile memory cells is partitioned into sectors, where each sector is placed in a first isolation well. Each sector of the array of the nonvolatile memory cells is divided into blocks and each block is divided into pages. Each page includes one row of the nonvolatile memory cells connected to a word line.

The nonvolatile memory device has a plurality of peripheral circuits that include a row decoder, a column decoder, and a source line decoder. The row decoder has a plurality of voltage isolators connected such that each voltage isolator is connected to the word lines of one block of the nonvolatile memory cells. Each voltage isolator is formed in a second isolation well such that biasing voltages as applied to the first and second isolation wells for reading, programming, erasing, and verifying selected nonvolatile memory cells do not exceed a low drain to source breakdown voltage of the peripheral circuits. Each of the peripheral circuit voltage isolators multiple pass gates are connected such that each pass gate transfers the operational signals to an associated word line for biasing control gates of charge retaining transistors of one row of the nonvolatile memory cells connected to the word line.

The row decoder has a first block selector that is activated when a block address indicates that a block is selected. The row decoder further includes a word line selector circuit connected to the first block selector, which, based on a row address, provides the word lines with word line operational voltage levels necessary for biasing the control gates of the nonvolatile memory cells for reading, programming, verifying, and erasing. The row decoder has a voltage level shifter for shifting a voltage level of a block select signal such that when the pass gates are activated, the operational voltage levels are transferred to the word lines of the selected block for biasing the control gates of the charge retaining transistors of the nonvolatile memory cells of the block for reading, programming, verifying, and erasing the selected nonvolatile memory cells.

The peripheral circuits of the nonvolatile memory device have a source decoder circuit that is connected to each source line within each block to transfer necessary source biasing voltage for reading, programming, verifying, and erasing selected nonvolatile memory cells to selected source lines. The source decoder circuit has a second block selector circuit that, when activated, selects the block being addressed. The block selector circuit is connected to a source voltage level shifter that shifts the voltage level of the block selector signals to transfer source line operational voltages to the source lines connected to the sources of the charge retaining transistors of the nonvolatile memory cells of the selected block for reading, programming, verifying, and erasing the selected nonvolatile memory cells.

The peripheral circuits of the nonvolatile memory device have a column decoder in communication with a local bit line for providing biasing voltages for reading, programming, verifying, and erasing selected nonvolatile memory cells. The row decoder, source decoder, and column decoder provide inhibit biasing voltage levels to all the non-selected nonvolatile memory cells to minimize disturbances resulting from the reading, programming, verifying, and erasing selected nonvolatile memory cells.

For reading a selected page of the array of nonvolatile memory cells, the row decoder transfers a voltage level of the power supply voltage source (VDD) to the word line of the selected nonvolatile memory cells for a single level program. The row decoder transfers an intermediate read voltage level to the word line of the selected nonvolatile memory cells for a multiple level program. The row decoder further transfers a ground reference voltage level to the word lines of the unselected nonvolatile memory cells. The column decoder transfers a first read biasing voltage of approximately +1.0V to the drains of the selected nonvolatile memory cells. The source decoder transfers the ground reference voltage level to the source lines of the selected nonvolatile memory cells and transfers a first source line read inhibit voltage to the source lines of unselected the nonvolatile memory cells. The magnitude of the power supply voltage source is either +1.8V or +3.0V. The magnitude of the first read inhibit voltage is approximately +1.0V For erasing a selected page of the array of nonvolatile memory cells, a very high negative erase voltage is applied to the first isolation well into which the sector of nonvolatile memory cells is formed. A very high positive erase voltage is applied to the second isolation well into which the pass gate of the word line for the selected page of nonvolatile memory cells is formed. The ground reference voltage level is applied to the second isolation wells into which the pass gates of the word lines for the unselected pages of nonvolatile memory cells are formed. The row decoder of the selected page transfers a very high positive erase voltage to the word line of the selected nonvolatile memory cells and transfers the ground reference voltage level to the word lines of the unselected nonvolatile memory cells of the selected block. The row decoders of the unselected blocks of nonvolatile memory cells disconnect the word lines of the unselected nonvolatile memory cells so that the very high negative erase voltage is coupled from the isolation well to the word lines of the unselected nonvolatile memory cells in unselected blocks. The source line decoder transfers the very high negative erase voltage to the selected and unselected source lines. The voltage levels of the very high positive erase voltage and the very high negative erase voltage is less than or equal to the drain to source breakdown voltage level of approximately 10.0V for transistors forming the row decoder, column decoder, and the source line decoder. The magnitude of the very high positive erase voltage is from approximately +8.0V to approximately +10.0V and the magnitude of the very high negative erase voltage is from approximately −8.0V to approximately −10.0V.

For verifying a page erase, a selected page of the array of nonvolatile memory cells, the row decoder transfers a voltage level of a lower boundary of an erased threshold voltage level to the word line of the selected nonvolatile memory cells. The row decoder further transfers a ground reference voltage level to the word lines of the unselected nonvolatile memory cells. The column decoder transfers a second read biasing voltage to the drains of the selected nonvolatile memory cells. The source decoder transfers the ground reference voltage level to the source lines of the selected nonvolatile memory cells and transfers a second source line read inhibit voltage to the source lines of the unselected nonvolatile memory cells. The lower boundary of an erased threshold voltage level is approximately +5.0V for the single level cell program and the multiple level cell programming. The magnitude of the second read biasing voltage is pre-charged to approximately the magnitude of the power supply voltage source less a threshold voltage of an NMOS transistor. The magnitude of the second source line read inhibit voltage is approximately +1.0V. The pre-charged second read biasing voltage level is discharged to approximately 0.0V when the memory cell has not been successfully erased to have its threshold voltage level greater than the lower boundary of the erased threshold voltage level. If the nonvolatile memory cells are erased, the pre-charged level will be maintained.

For erasing a selected block of the array of nonvolatile memory cells, a very high negative erase voltage is applied to the first isolation well into which the sector of nonvolatile memory cells is formed. A very high positive erase voltage is applied to the second isolation wells into which the pass gates of the word lines for the selected block of nonvolatile memory cells are formed. The ground reference voltage level is applied to the second isolation wells into which the pass gates of the word lines for the unselected blocks of nonvolatile memory cells are formed. The row decoder transfers a very high positive erase voltage to the word lines of the nonvolatile memory cells of the selected block. The row decoders of the unselected blocks of nonvolatile memory cells disconnect the word lines of the unselected nonvolatile memory cells so that the very high negative erase voltage is coupled from the isolation well to the word lines of the unselected nonvolatile memory cells in unselected blocks. The source line decoder transfers the very high negative erase voltage to the selected and unselected source lines. The very high negative erase voltage is applied to the isolation well. The magnitude of the very high positive erase voltage and the very high negative erase voltage is less than or equal to the drain to source breakdown voltage level of approximately 10V for transistors forming the row decoder, column decoder, and the source line decoder. The magnitude of the very high positive erase voltage is from approximately +8.0V to approximately +10.0V and the magnitude of the very high negative erase voltage is from approximately −8.0V to approximately −10.0V.

For verifying a block erase, the row decoder transfers a voltage level of a lower boundary of an erased threshold voltage level to the word lines of the selected nonvolatile memory cells of the selected block. The row decoder further transfers a ground reference voltage level to the word lines of the unselected nonvolatile memory cells of the unselected block. The column decoder transfers the third read biasing voltage to the drains of the selected nonvolatile memory cells. The source decoder transfers the ground reference voltage level to the source lines of the selected nonvolatile memory cells and transfers the first source line read inhibit voltage to the source lines of the unselected nonvolatile memory cells. The lower boundary of an erased threshold voltage level is approximately +5.0V for the single level cell program and the multiple level cell programming. The magnitude of the third read biasing voltage is approximately the voltage level of the power supply voltage source less a threshold voltage of an NMOS transistor. The magnitude of the first source line read inhibit voltage is approximately +1.0V. The lower boundary of an erased threshold voltage level is approximately +5.0V. The pre-charged level of the second read biasing voltage is discharged to approximately 0.0V when the memory cell has not been successfully erased to lower boundary of the erased threshold voltage level. If the nonvolatile memory cells are erased, the pre-charged level will be maintained when the threshold voltage of the erased nonvolatile memory cells is greater than the erased threshold voltage level.

For erasing a selected sector of the array of nonvolatile memory cells, a very high negative erase voltage is applied to the first isolation well into which the sector of nonvolatile memory cells is formed. A very high positive erase voltage is applied to the second isolation wells into which the pass gates of the word lines for the selected sector of nonvolatile memory cells are formed. The row decoder transfers a very high positive erase voltage to the word lines of the nonvolatile memory cells of the selected sector. The source line decoder transfers the very high negative erase voltage to the source lines. The magnitude of the very high positive erase voltage and the very high negative erase voltage is less than or equal to the drain to source breakdown voltage level of approximately 10V for transistors forming the row decoder, column decoder, and the source line decoder. The magnitude of the very high positive erase voltage is from approximately +8.0V to approximately +10.0V and the magnitude of the very high negative erase voltage is from approximately −8.0V to approximately −10.0V.

For verifying erasing a selected sector, the row decoder transfers the voltage level of a lower boundary of an erased threshold voltage level to the word lines of the selected nonvolatile memory cells. The row decoder further transfers a ground reference voltage level to the word lines of the unselected nonvolatile memory cells. The column decoder transfers the fourth read biasing voltage to the drains of the selected nonvolatile memory cells. The source decoder transfers the ground reference voltage level to the source lines of the selected sector of the nonvolatile memory cells. The lower boundary of an erased threshold voltage level is approximately 5.0V for the single level cell program and the multiple level cell programming. The magnitude of the fourth read biasing voltage is approximately the voltage level of the power supply voltage source less a threshold voltage of an NMOS transistor. The lower boundary of an erased threshold voltage level is approximately +5.0V. The pre-charged level of the second read biasing voltage is discharged to approximately 0.0V when the memory cell has not been successfully erased to the erased threshold voltage level. If the nonvolatile memory cells are erased, the pre-charged read biasing voltage level will be maintained.

For programming a selected page of the array of nonvolatile memory cells, the ground reference voltage level is applied to the second isolation wells into which the pass gates of the word lines for the selected and unselected pages of nonvolatile memory cells are formed. The row decoder transfers a very high negative program voltage to the word line of the selected nonvolatile memory cells. The row decoder transfers a negative word line program inhibit voltage to the unselected word lines in the selected block and the unselected blocks of the array of nonvolatile memory cells. The column decoder transfers a high program select voltage to the bit lines and thus to the drains of the selected nonvolatile memory cells. The source line decoder transfers the ground reference voltage level to the source lines connected to the selected nonvolatile voltage cells. Alternately, the source line decoder disconnects the source lines connected to the selected nonvolatile voltage cells to allow them to float. The source line decoder transfers a source line program inhibit voltage to the source lines of the unselected nonvolatile memory cells. The magnitude of the very high negative program voltage is less than or equal to the breakdown voltage level of approximately 10.0V for transistors forming the row decoder. The magnitude of the high negative program voltage is from approximately −8.0V to approximately −10.0V. The magnitude of the negative word line program inhibit voltage is approximately −2.0V. The high program select voltage is approximately +5.0V. The source line program inhibit voltage is from approximately +1.5V to approximately +1.8V.

For verifying a page program, a selected page of the array of nonvolatile memory cells, the row decoder transfers a voltage level of an upper boundary of a programmed threshold voltage level to the word line of the selected nonvolatile memory cells when the array of nonvolatile memory cells are programmed for single level cell programming and iteratively transfers the upper boundaries of a first threshold voltage level, a second threshold voltage level and a third threshold voltage level when the array of nonvolatile memory cells are programmed for multiple level cell programming. The row decoder further transfers a ground reference voltage level to the word lines of the unselected nonvolatile memory cells. The column decoder transfers a fifth read biasing voltage to the drains of the selected nonvolatile memory cells. The source decoder transfers the ground reference voltage level to the source lines of the selected nonvolatile memory cells. The upper boundary of a programmed threshold voltage level is approximately +0.5V for the single level cell programming. The upper boundaries of a first threshold voltage level, a second threshold voltage level and a third threshold voltage level are respectively +0.5V, +2.0V, and +3.5V for the multiple level cell programming. The magnitude of the fifth read biasing voltage is approximately +5.0V. The magnitude of the second read inhibit voltage is pre-charged to approximately the voltage level of the power supply voltage source less a threshold voltage of an NMOS transistor. The magnitude of the second source line read inhibit voltage is approximately +1.0V. The pre-charged level of the second read voltage is discharged to approximately 0.0V once memory cell has not been successfully programmed to the upper level of programmed threshold voltage level. If the nonvolatile memory cells are programmed, the pre-charged level will be maintained.

In other embodiments, a method for operating an array includes steps for providing the operating conditions for reading, page erasing, block erasing, sector erasing, page erase verifying, block erase verifying, sector erase verifying, page programming, and page program verifying of selected nonvolatile memory cells of the array of nonvolatile memory cells. In the step of reading a selected page of the array of nonvolatile memory cells, begins by transferring a voltage level of the power supply voltage source (VDD) to the word line of the selected nonvolatile memory cells when the array of nonvolatile memory cells are programmed with a single level program. An intermediate read voltage level is transferred to the word line of the selected nonvolatile memory cells when the array of nonvolatile memory cells is programmed with a multiple level program. A ground reference voltage level is transferred to the word lines of the unselected nonvolatile memory cells. A first read biasing voltage is transferred to the drains of the selected nonvolatile memory cells. The ground reference voltage level is transferred to the source lines of the selected nonvolatile memory cells and a first source line read inhibit voltage is transferred to the source lines of the nonvolatile memory cells. The voltage level of the power supply voltage source (VDD) is either +1.8V or +3.0V. The magnitude of the first read biasing voltage is approximately +5.0V. The magnitude of the first source line read inhibit voltage is approximately +1.0V In the step of erasing a selected page of the array of nonvolatile memory cells, a very high negative erase voltage is applied to the first isolation well into which the sector of nonvolatile memory cells is formed. A very high positive erase voltage is applied to the second isolation well into which the pass gate of the word line for the selected page of nonvolatile memory cells is formed. The ground reference voltage level is applied to the second isolation wells into which the pass gates of the word lines for the unselected pages of nonvolatile memory cells are formed. A very high positive erase voltage is transferred to the word line of the selected nonvolatile memory cells and the ground reference voltage level is transferred to the word lines of the unselected nonvolatile memory cells of the selected block. The step of erasing a selected pages continues with disconnecting the word lines of the unselected nonvolatile memory cells so that the very high negative erase voltage is coupled from the first isolation well to the word lines of the unselected nonvolatile memory cells in unselected blocks. The very high negative erase voltage is transferred to the selected and unselected source lines. The voltage levels of the very high positive erase voltage and the very high negative erase voltage are less than or equal to the drain to source breakdown voltage level of approximately WV for transistors forming the row decoder, column decoder, and the source line decoder. The magnitude of the very high positive erase voltage is from approximately +8.0V to approximately +10.0V and the magnitude of the very high negative erase voltage is from approximately −8.0V to approximately −10.0V.

In the step of verifying a page erase, a selected page of the array of nonvolatile memory cells, a voltage level of a lower boundary of an erased threshold voltage level is transferred to the word line of the selected nonvolatile memory cells. The ground reference voltage level is transferred to the word lines of the unselected nonvolatile memory cells. A second read biasing voltage is transferred to the drains of the selected nonvolatile memory cells. The ground reference voltage level is transferred to the source lines of the selected nonvolatile memory cells and a first source line read inhibit voltage is transferred to the source lines of the unselected nonvolatile memory cells. The lower boundary of an erased threshold voltage level is approximately +5.0V for the single level cell program and the multiple level cell is programming. The magnitude of the power supply voltage source is either +1.8V or +3.0V. The magnitude of the read biasing voltage is approximately +5.0V. The magnitude of the second read inhibit voltage is approximately the voltage level of the power supply voltage source less a threshold voltage of an NMOS transistor. The magnitude of the first source line read inhibit voltage is approximately +1.0V. The pre charged level of the second read voltage is discharged to approximately 0.0V when the memory cell has not been successfully erased. If the nonvolatile memory cells are erased, the pre-charged second read biasing voltage level will be maintained.

In the step of erasing a selected block of the array of nonvolatile memory cells, a very high negative erase voltage is applied to the first isolation well into which the sector of nonvolatile memory cells is formed. A very high positive erase voltage is applied to the second isolation wells into which the pass gate of the word lines for the selected block of nonvolatile memory cells are formed. The ground reference voltage level is applied to the second isolation wells into which the pass gates of the word lines for the unselected blocks of nonvolatile memory cells are formed. A very high positive erase voltage is transferred to the word lines of the nonvolatile memory cells of the selected block. The word lines of the unselected nonvolatile memory cells are disconnected so that the very high negative erase voltage is coupled from the isolation well to the word lines of the unselected nonvolatile memory cells in unselected blocks. The very high negative erase voltage is transferred to the selected and unselected source lines. The voltage levels of the very high positive erase voltage and the very high negative erase voltage less than or equal to the drain to source breakdown voltage level of approximately 10V for transistors forming the row decoder, column decoder, and the source line decoder. The magnitude of the very high positive erase voltage is from approximately +8.0V to approximately +10.0V and the magnitude of the very high negative erase voltage is from approximately −8.0V to approximately −10.0V.

In the step of verifying a block erase, a voltage level of a lower boundary of an erased threshold voltage level is transferred to the word lines of the selected nonvolatile memory cells of the selected block. The ground reference voltage level is transferred to the word lines of the unselected nonvolatile memory cells of the unselected blocks. The third read biasing voltage is transferred to the drains of the selected nonvolatile memory cells. The ground reference voltage level is transferred to the source lines of the selected block of the nonvolatile memory cells and a third source line read inhibit voltage is transferred to the source lines of the unselected nonvolatile memory cells. The magnitude of the second read biasing voltage is pre-charged to approximately the voltage level of the power supply voltage source less a threshold voltage of an NMOS transistor. The magnitude of the third source line read inhibit voltage is approximately +1.0V. The pre-charged second read biasing voltage level of the second read voltage is discharged to approximately 0.0V when the memory cell has not been successfully erased. If the nonvolatile memory cells are erased, the pre charged level will be maintained.

In the step for erasing a selected sector of the array of nonvolatile memory cells, a very high negative erase voltage is applied to the first isolation well into which the sector of nonvolatile memory cells is formed. A very high positive erase voltage is applied to the second isolation wells into which the pass gates of the word lines for the selected sector of nonvolatile memory cells are formed. A very high positive erase voltage is transferred to the word lines of the nonvolatile memory cells of the selected sector. The very high negative erase voltage is transferred to the source lines. The very high negative erase voltage is applied to the isolation well. The voltage levels of the very high positive erase voltage and the very high negative erase voltage are less than or equal to the drain to source breakdown voltage level of approximately 10V for transistors forming the row decoder, column decoder, and the source line decoder. The magnitude of the very high positive erase voltage is from approximately +8.0V to approximately +10.0V and the magnitude of the very high negative erase voltage is from approximately −8.0V to approximately −10.0V.

For verifying erasing a sector, a voltage level of a lower boundary of an erased threshold voltage level is transferred to the word lines of the selected nonvolatile memory cells. The ground reference voltage level is transferred to the word lines of the unselected nonvolatile memory cells. The fourth read biasing voltage is transferred to the drains of the selected nonvolatile memory cells. The ground reference voltage level is transferred to the source lines of the selected nonvolatile memory cells. The magnitude of the fourth read biasing voltage is approximately the voltage level of the power supply voltage source less a threshold voltage of an NMOS transistor. The pre charged fourth read biasing voltage level is discharged to approximately 0.0V when the memory cell has not been successfully erased. If the nonvolatile memory cells are erased, the pre-charged fourth read biasing voltage level will be maintained.

In the step for programming a selected page of the array of nonvolatile memory cells, a very high negative program voltage is transferred to the word line of the selected nonvolatile memory cells. A negative word line program inhibit voltage is transferred to the unselected word lines in the selected block and the unselected word lines of the unselected blocks of the array of nonvolatile memory cells. A high program select voltage is transferred to the bit lines and thus to the drains of the selected nonvolatile memory cells. The ground reference voltage level is transferred to the source lines connected to the selected nonvolatile voltage cells. Alternately, the source lines connected to the selected nonvolatile voltage cells are disconnected to be floating. A source line program inhibit voltage is transferred to the source lines of the unselected nonvolatile memory cells. The voltage level of the very high negative program voltage is less than or equal to the drain to source breakdown voltage level of approximately 10.0V for transistors forming the row decoder. The magnitude of the high negative program voltage is from approximately −8.0V to approximately −10.0V. The magnitude of the negative bit line program inhibit voltage is approximately −2.0V. The high program select voltage is approximately +5.0V. The source line program inhibit voltage is from approximately +1.5V to approximately +1.8V.

In the step for verifying a page program, a selected page of the array of nonvolatile memory cells, The voltage level of an upper boundary of a programmed threshold voltage level is transferred to the word line of the selected nonvolatile memory cells when the array of nonvolatile memory cells are programmed with a single level cell programming and iteratively transfers the upper boundaries of a first threshold voltage level, a second threshold voltage level and a third threshold voltage level to the word line of the selected nonvolatile memory cells when the array of nonvolatile memory cells are programmed with multiple level cell programming. The ground reference voltage level is transferred to the word lines of the unselected nonvolatile memory cells. A fifth read biasing voltage is transferred to the drains of the selected nonvolatile memory cells. The ground reference voltage level is transferred to the source lines of the selected nonvolatile memory cells and transfers a fifth source line read inhibit voltage to the source lines of the unselected nonvolatile memory cells. The upper boundary of a programmed threshold voltage level is approximately +0.5V for the single level cell programming. The upper boundaries of a first threshold voltage level, a second threshold voltage level and a third threshold voltage level are respectively+0.5V, +2.5V, and +3.5V for the multiple level cell programming. The magnitude of the read biasing voltage is pre-charged to approximately the voltage level of the power supply voltage source less a threshold voltage of an NMOS transistor. The magnitude of the fifth source line read inhibit voltage is approximately +1.0V. The pre-charged level of the fifth read biasing voltage is discharged to approximately 0.0V when the memory cell has not been successfully erased. If the nonvolatile memory cells are erased, the pre charged fifth read biasing voltage level will be maintained.

BRIEF DESCRIPTION OF THE DRAWINGS

FIG. 1a is a top plan layout view of a single transistor floating-gate NMOS NOR flash cell of the prior art.

FIG. 1b is a cross sectional view of a single transistor floating-gate NMOS NOR flash cell of the prior art.

FIG. 1c is a schematic diagram of a single transistor floating-gate NMOS NOR flash cell of the prior art.

FIG. 1d is a graph of two threshold voltage distributions of a single transistor floating-gate NMOS NOR flash cell having a positive erase level and a single positive program level of the prior art.

FIG. 1e is a graph of four threshold voltage distributions of a single transistor floating-gate NMOS NOR flash cell having a positive erase level and three positive program levels of the prior art.

FIG. 13a is a table illustrating the voltage conditions applied to an array of a floating-gate transistor NMOS NOR flash cells having single level programmed cells (SLC) embodying the principles of the present invention.

FIG. 13b is a table illustrating the voltage conditions applied to an array of a floating-gate transistor NMOS NOR flash cells having multiple-level programmed cells (MLC) embodying the principles of the present invention.

FIG. 14a is a table illustrating the voltage conditions applied to the row decoder of FIG. 6 for the nonvolatile memory device having single level programmed cells (SLC) embodying the principles of the present invention.

FIG. 14b is a table illustrating the voltage conditions applied to the row decoder of FIG. 6 for the nonvolatile memory device for nonvolatile memory device having multiple-level programmed cells (MLC) embodying the principles of the present invention.

FIG. 15 is a table illustrating the voltage conditions applied to the source line decoder of FIG. 6 for the nonvolatile memory device for nonvolatile memory device embodying the principles of the present invention.

DETAILED DESCRIPTION OF THE INVENTION

Figure 2A:
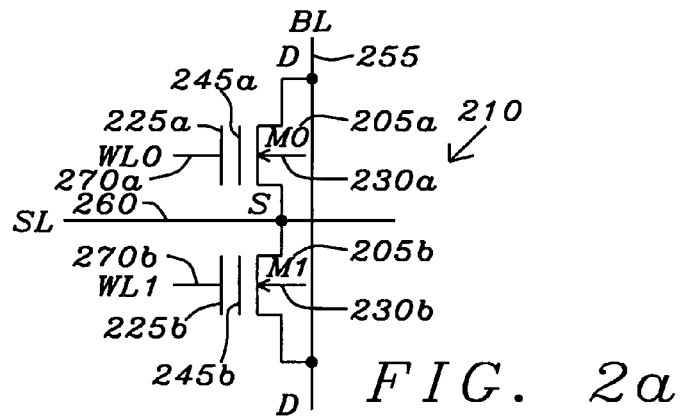
FIG. 2a is a schematic diagram of a serial string of floating-gate transistor NMOS NOR flash cells.

FIG. 1a is a top plan view of a NMOS NOR flash floating-gate transistor 110 of the prior art. FIG. 1b is a cross sectional view NMOS NOR flash floating-gate transistors 110 of the prior art. FIG. 1c is the schematic symbol NMOS NOR flash floating-gate transistors 110 of the prior art. The floating-gate type NMOS NOR flash transistor cell 110 is formed in the top surface of a substrate 140. An N-type material is diffused into the surface of the P-type substrate 140 to form a deep N-well 135. A P-type material is then diffused into the surface of the deep N-well 135 to form a P-well 130 (commonly referred to as a triple P-well). The N-type material is then diffused into the surface of a P-type well 130 to form the drain (D) 115 and the self-aligned source (S) 120 of the NMOS NOR flash floating-gate transistor 110. A first polycrystalline silicon layer is formed above the bulk region 132 of the P-type well 130 between the drain region 115 and the source region 120 to form the floating gate 145. A second polycrystalline silicon layer is formed over the floating gate 145 to create a control gate (G) 125 of the NMOS NOR flash floating-gate transistors 110. The self-aligned source 120 is formed self-aligned between two adjacent second polycrystalline silicon layers of two control gates 125 of a pair of NMOS NOR flash floating-gate transistors 110. The self-aligned source 120 is commonly used in NMOS NOR flash floating-gate transistors 110 to reduce the source line pitch.

The gate length of the NMOS NOR flash floating-gate transistors 110 is the channel region 132 in the bulk region of P-type well 130 between drain region 115 and the source region 120. The NMOS NOR flash floating-gate transistor's 110 channel width is determined by the width of the N-diffusion of the drain 115 and the source 120. The typical unit size of the NMOS NOR flash floating-gate transistors 110 is about $10\lambda^2$ to $12\lambda^2$.

The floating-gate layer 145 stores electron charges to modify the threshold voltage of the NMOS NOR flash floating-gate transistors 110. In all operations, the P-type substrate 140 is connected to a ground reference voltage source (GND). The deep N-well 135 is connected to the power supply voltage source (VDD) in read and program operations and is connected to a large positive programming voltage level of approximately +10V in the Fowler-Nordheim channel erase operation. In present designs of NMOS NOR flash floating-gate transistors 110, the power supply voltage source is either 1.8V or 3.0V. The triple P-type well 130 is connected to the ground reference voltage in normal read and program operation and is connected to a large positive erasing voltage level of approximately +10V during erase operation. In other words, during the Fowler-Nordheim channel erase operation, both the deep N-well 135 and the triple P-well 130 are biased with the same voltage of approximately +10V to avoid forward leakage current through the P/N junction through the deep N-well 135 and the triple P-well 130.

In an array of NMOS NOR flash floating-gate transistors 110, the NMOS NOR flash floating-gate transistors 110 are arranged in rows and columns. The second polycrystalline silicon layer 125 that is the control gate of the NMOS NOR flash floating gate transistors 110 is extended to form a word-line that connects to each of the NMOS NOR flash floating-gate transistors 110 on a row of the array.

A tunnel oxide 150 is formed on top of the channel region 132 between the drain region 115 and the source region 120 and the floating-gate 145. The thickness of the tunnel oxide 150 typically 100 Å. The tunnel oxide 150 is the layer through which the electron charges pass during the high current channel-hot-electron programming and low current Fowler-Nordheim channel erasing. In a traditional NOR operation, Fowler-Nordheim channel erasing expels stored electrons from the floating gate 145 through the tunnel oxide 150 to cell's channel region 132 into the triple P-type well 130.

After an erase operation, fewer electron charges are stored in the floating gate 145 that results in a decrease in the NMOS NOR flash floating-gate transistor's 110 first threshold voltage level (Vt0) of less than approximately 2.5V. In contrast, in a channel-hot-electron program operation, electrons are attracted into floating-gate 145 so that the NMOS NOR flash floating-gate transistor's 110 second threshold voltage level (Vt1) is set to the voltage greater than approximately 4.0V. The distributions of the first threshold voltage level (Vt0) for an erased state with a wide distribution and the second threshold voltage level (Vt1) for a programmed state with a narrow distribution are set to be positive to avoid any false reading induced by the NMOS NOR flash floating-gate transistors 110 having a negative threshold voltage level.

FIG. 1d is a graph of two threshold voltage distributions of a single transistor floating-gate NMOS NOR flash cell having a single program level. After an erase operation, there are fewer electron charges in the floating-gate 145 that result in lowering the threshold voltage of the NMOS NOR flash floating-gate transistors 110. Normally, the erased NMOS NOR flash floating-gate transistors 110 has a maximum value of its threshold voltage set to approximately +2.5V. In contrast, in channel-hot electron-programming, electrons are attracted to the floating-gate 145 so that threshold voltage of the NMOS NOR flash floating-gate transistors 110 is increased to a minimum voltage level of approximately +4.0V. By convention, the erased voltage threshold (Vt0) value of approximately +2.5V is designated as a logical data value of "1" and the programmed voltage threshold (Vt1) of +4.0V is designated as a logical data value of "0". The NMOS NOR flash floating-gate transistors 110 store a single bit of data is referred to as a one-bit/one-transistor NMOS NOR flash floating-gate cell (1b1T).

FIG. 1e is a graph of four threshold voltage distributions of a single transistor floating-gate NMOS NOR flash cell having one erase level and three program levels. It is known in the art that by varying the program conditions more than two threshold voltage levels can be created based on the quantity of charge placed on the floating-gate 145 of the NMOS NOR flash floating-gate transistors 110. This is commonly referred to as multiple level programming of a NMOS NOR flash floating-gate cell or multi-level programmed cell. In this example, there are four threshold voltage levels that can be programmed to the NMOS NOR flash floating-gate transistors 110. The least positive wide-distribution threshold voltage level Vt0 is the erased voltage level with a maximum value of +2.5V for storing a logical data value of "11". The three positive narrow-distribution programmed voltage threshold voltage levels are set to be sufficiently spaced apart to allow accurate detection. In the present example, the first of the three positive voltage threshold levels Vt1 has a nominal value of approximately −3.25V for storing a logical data value "10". The second of the three voltage positive threshold levels Vt2 has a nominal value of approximately +4.25V for storing a logical data value "01". The third of the three positive voltage threshold level Vt3 has a nominal value of approximately +5.25V for storing a logical data value "00". Since each NMOS NOR flash floating-gate transistor 110 stores four distinctive positive threshold voltage states, each NMOS NOR flash floating-gate transistor 110 stores two bits binary data and is referred to as a two-bit/one-transistor NMOS NOR flash cell (2b/1T).

The nominal values of threshold voltages Vt1 and Vt2 of the NMOS NOR flash floating-gate transistors 110 may vary by more than 1.0V among different designs. The nominal values of threshold voltages Vt0 and Vt3 can have a wider threshold voltage distribution. For example, the threshold voltage Vt0 is may vary from approximately 1.0V to approximately 2.5V. The threshold voltage Vt3 can have much wider distribution. It must have a voltage greater than approximately 4.5V to ensure that the NMOS NOR flash floating-gate transistors 110 is in a non-conduction state. The assigned designations of 2-bit data states for four threshold voltage states may also vary between NMOS NOR flash floating-gate cell designs as described above in the NMOS NAND flash floating-gate cell.

Figure 2B:
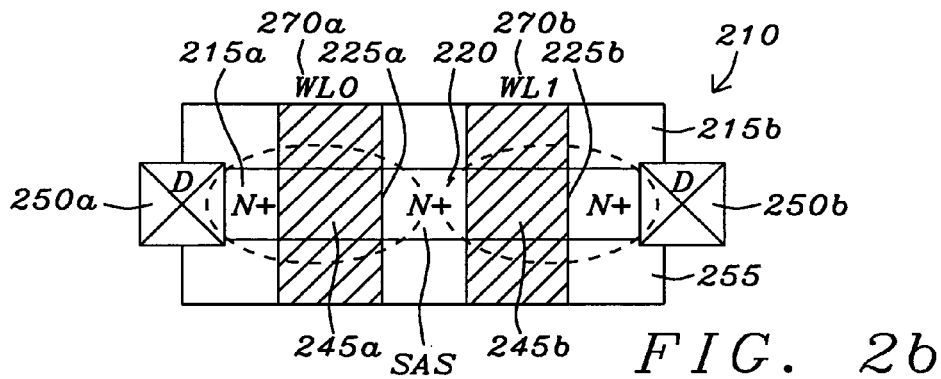
FIG. 2b is a top plan layout view of a serial string of floating-gate transistor NMOS NOR flash cells.
Figure 2C:
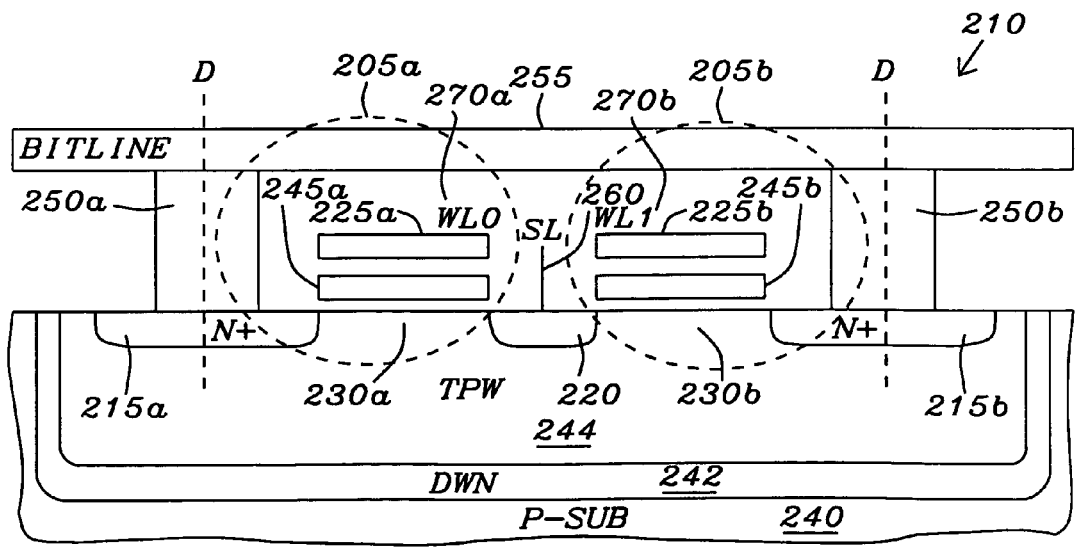
FIG. 2c is a cross sectional view of a floating-gate transistor NMOS NOR flash cell.

FIG. 2a is a schematic diagram of a serial string of floating-gate transistor NMOS NOR flash cells. FIG. 2b is a top plan layout view of a serial string of floating gate transistor NMOS NOR flash cells. FIG. 2c is a cross sectional view of a floating gate transistor NMOS NOR flash cell. The two-transistor floating-gate type NMOS NOR flash cell 210 is formed in a P-type well TPW 244 within a deep N-well DNW 242 that are formed in the top surface of a P-type substrate 240. An N-type material is then diffused into the surface of the P-type well TPW 240 to form the drains (D) 215a and 215b of the two NMOS NOR floating gate transistors 205a and 205b and the self aligned source (S) 220. The self-aligned source (S) 220 is shared by the two NMOS NOR floating gate transistors 205a and 205b. A first polycrystalline silicon layer is formed over the bulk regions 230a and 230b between the drain regions 215a and 215b and the self-aligned source region 220 to form the floating gates 245a and 245b. A second polycrystalline silicon layer is formed over the floating gates 245a and 245b to create the control gates (G) 225a and 225b of the floating-gate transistors 205a and 205b. The self-aligned source 220 is formed self-aligned between two adjacent second polycrystalline silicon layers of two control gates 225a and 225b of a pair of NMOS NOR two floating gate transistors 205a and 205b. The self-align source 220 is commonly used in NMOS NOR flash floating-gate transistors 210 to reduce the source line pitch. The drain regions 215a and 215b each have a metal contact 250a and 250b.

Each of the control gates control gates 225a and 225b are connected to word lines 270a and 270b. The word lines 270a and 270b connecting each of the control gates 225a and 225b of the floating gate transistors 205a and 205b located on a row of an array of the NMOS NOR floating gate transistors 205a and 205b. The two metal contacts 250a and 250b are connected to and shorted by a common metal bit line 255. The self-aligned source (S) 220 is connected to source line 260. Having the sources 220 and drains 215a and 215b of each pair of the NMOS NOR flash floating-gate transistors 210 connected together places the devices essentially in parallel.

Figure 2D:
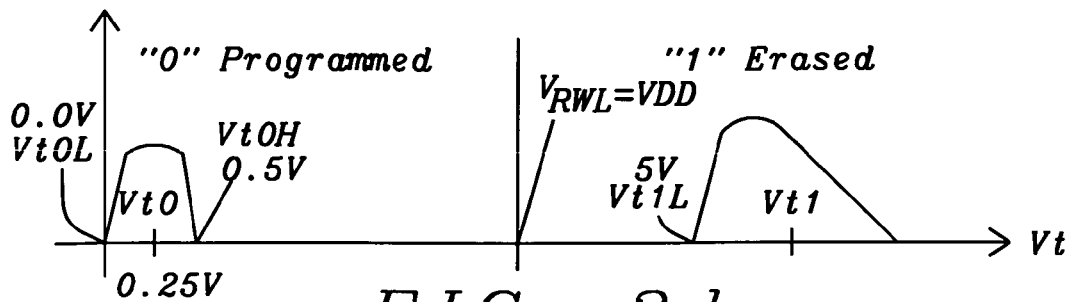
FIG. 2d is a plot of two threshold voltage distributions of a floating-gate transistor NMOS NOR flash cell having a positive program level and a single positive erase level of one implementation embodying the principles of the present invention.

FIG. 2d is a plot of two threshold voltage distributions of a floating-gate transistor NMOS NOR flash cell having a positive program level and a single positive erase level for a single level program cell (SLC) of one implementation embodying the principles of the present invention. The NMOS NOR floating gate transistors 205a or 205b may be programmed as single level program cells in which the source line 260 and the P-type well TPW 244 are biased to the voltage level of the ground reference voltage (0.0V). The programmed threshold voltage level Vt0 is the programmed state for storing a datum of a logical "0". The erased threshold voltage level Vt1 is the erased state for storing a datum of a logical "1". The programmed state is accomplished using a Fowler-Nordheim edge programming scheme and the erase state is accomplished using a Fowler-Nordheim channel erase scheme. The low and narrow programmed threshold voltage level Vt0 is the result of a bit-by-bit and iterative program operation such that the programmed threshold voltage level Vt0 is easily be controlled. A low and narrow distribution programmed threshold voltage level Vt0 achieves a fast, low-voltage VDD read operation such that there is no requirement for boosted voltage applied to the word lines 270a and 270b voltage. In the prior art the word lines 270a and 270b are usually boosted to a voltage level that is higher than the voltage level of the power supply voltage source VDD by a charge-pump circuit.

The positive erased state of threshold voltage level Vt1 for storing a datum of a logical "1" may have a wide distribution of threshold voltage levels between the floating gate transistors 205a and 205b. The lower boundary of the distribution of the erased threshold voltage level Vt1 is larger than approximately +5.0V. The programmed threshold voltage level Vt0 for storing a datum of a logical "0" has distribution ranging from the lower boundary of the programmed threshold voltage level Vt0L of approximately 0.0V to an upper boundary of the programmed threshold voltage level Vt0H of approximately +0.5V. The nominal value of the programmed threshold voltage level Vt0 is approximately +0.25V. The preferred word line 270a and 270b read voltage, VRWL to distinguish between a logical "0" and a logical "1" may be set to a voltage level of the power supply voltage source VDD. The word line read voltage level VRWL is set between upper boundary of the programmed threshold voltage Vt0H and the lower boundary of the erased threshold voltage level Vt1L for a single level programmed cell read operation. This permits the read operation to occur without having a boosted read voltage applied to the word lines 270a and 270b.

Figure 2E:
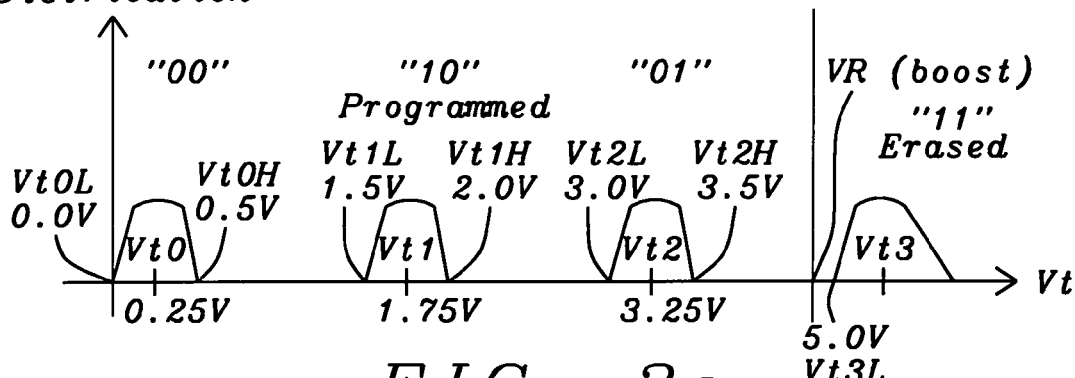
FIG. 2e is a plot of four threshold voltage distributions of a floating-gate transistor NMOS NOR flash cell having a positive erase level and three positive program levels of one implementation embodying the principles of the present invention.

FIG. 2e is a plot of four threshold voltage distributions of a floating-gate transistor NMOS NOR flash cell having a positive erase level and three positive program levels for multiple level cell programming. The NMOS NOR floating gate transistors 205a or 205b may be programmed as multiple level program cells in which the source line 260 and the P-type well TPW 244 are biased to the voltage level of the ground reference voltage (0.0V). The four threshold voltages of this implementation include a high, wide, positive erased threshold voltage level Vt3, a first positive programmed state Vt2, a second positive programmed threshold voltage level Vt1, and a third positive programmed threshold voltage level Vt0. The positive erased threshold voltage level Vt3 stores a data of a logical "11" of 2-bit digital data with a lower boundary of the positive erased threshold voltage level Vt3 that is greater than +5.0V. The second threshold voltage level is a narrow programmed threshold voltage level Vt2 for a storing a data of a logical "01". The first programmed threshold voltage level Vt2 has a nominal value of approximately +3.25V with a distribution of 0.5V about the nominal value. The lower boundary of the first programmed threshold voltage level Vt2L is approximately +3.0V and the upper boundary of the first programmed threshold voltage level Vt2H is approximately +3.5V. The third threshold voltage level is a narrow second positive programmed threshold voltage level Vt1 for storing a data of a logical "10" of 2-bit digital data. The second positive programmed threshold voltage level Vt1 has a nominal value of approximately +1.75V with a distribution of approximately 0.5V. The lower boundary of the second positive programmed threshold voltage level Vt1L is approximately +1.5 and the upper boundary of the second positive programmed threshold voltage level Vt1H is approximately +2.0V. The fourth threshold voltage level is a narrow third positive programmed threshold voltage level Vt0 for storing a data of a logical "00" of 2-bit digital data. The third positive programmed threshold voltage level Vt0 has a nominal value of approximately +0.25V with a distribution of approximately 0.5V. The lower boundary of the third positive programmed threshold voltage level Vt0L is approximately +0.0V and the upper boundary of the second positive programmed threshold voltage level Vt0H is approximately +0.5V.

Figure 2F:
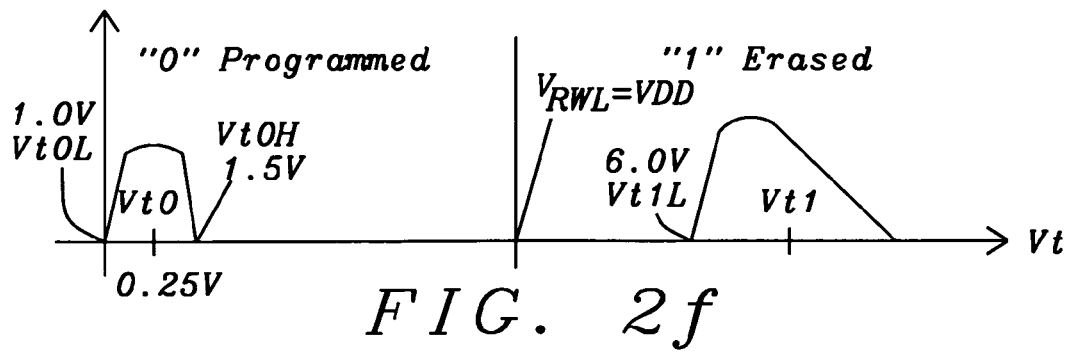
FIG. 2f is a plot of two threshold voltage distributions of a floating-gate transistor NMOS NOR flash cell having a positive program level and a single positive erase level shifted while biasing the source line to a magnitude of approximately +1.0V.

FIG. 2f is a plot of two threshold voltage distributions of a floating-gate transistor NMOS NOR flash cell that is shifted while biasing the source line to a magnitude of approximately 1.0V and having a positive program level and a single positive erase level. The programmed threshold voltage level Vt0 and the erased threshold voltage level Vt1 for the NMOS NOR floating gate transistors 205a or 205b are the same as those shown in FIG. 2d except the source line 260 and is biased to a magnitude of approximately +1.0V. The threshold voltage shift of +1.0V in a positive direction does consider the NMOS body-effect. The programmed threshold voltage level Vt0 has a distribution that varies from lower boundary of the programmed state Vt0L of approximately +1.0V to upper boundary of the programmed threshold voltage level Vt0H of approximately +1.5V. Similarly, the lower boundary of the distribution of the erased threshold voltage level Vt1L is shifted to approximately +6.0V.

Figure 2G:
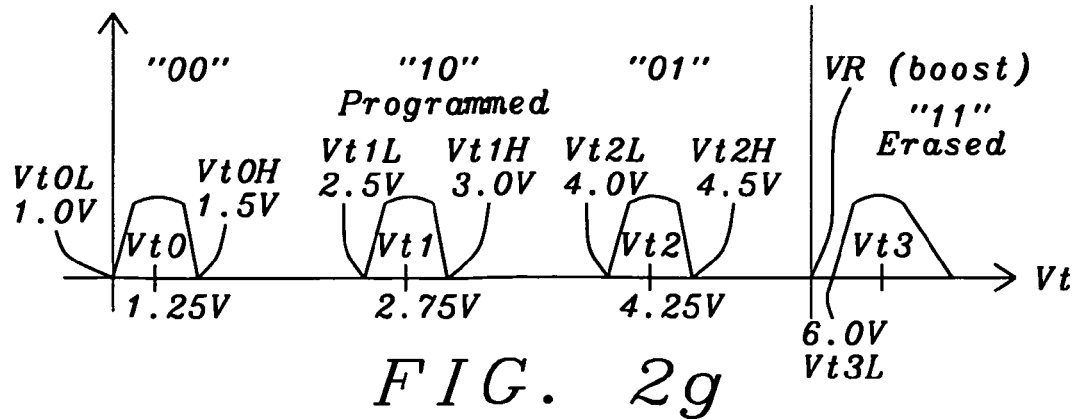
FIG. 2g is a plot of four threshold voltage distributions of a floating-gate transistor NMOS NOR flash cell having a positive erase level and three positive program levels shifted while biasing the source line to a magnitude of approximately +1.0V.

FIG. 2g is a plot of four threshold voltage distributions of a floating-gate transistor NMOS NOR flash cell that is shifted while biasing the source line to a magnitude of approximately 1.0V and having a positive erased state Vt3, a first positive programmed state Vt2, a second positive programmed state Vt1, and a third positive programmed state Vt0. The threshold voltages Vt3, Vt2, Vt1, and Vt0 have distributions that are similar to those described in FIG. 2e, except the source line 260 is biased to a magnitude of approximately +1.0V. Shifting the threshold voltage levels Vt3, Vt2, Vt1, and Vt0 does not consider the NMOS body-effect. The positive erased threshold voltage level Vt3 has the lower boundary Vt3L of approximately +6.0V. The first positive programmed threshold voltage level Vt2 varies from the lower boundary Vt2L of approximately +4.0V to an upper boundary Vt2H of approximately +4.25V. The second positive programmed threshold voltage level Vt1 varies from the lower boundary Vt2L of approximately +2.5V to an upper boundary Vt0H of approximately +3.0V. The third positive programmed threshold voltage level Vt0 varies from the lower boundary Vt0L of approximately +1.0V to an upper boundary Vt0H of approximately +1.5V.

Figure 3A:
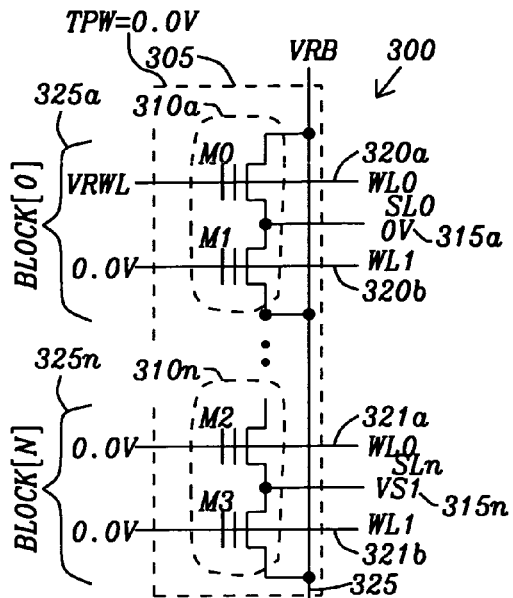
FIGS. 3a-3c are schematic diagrams of floating-gate transistor NMOS NOR flash cells illustrating the bias conditions reading, programming and page erasing of a floating-gate transistor NMOS NOR flash cells embodying the principles of the present invention.
Figure 3C:
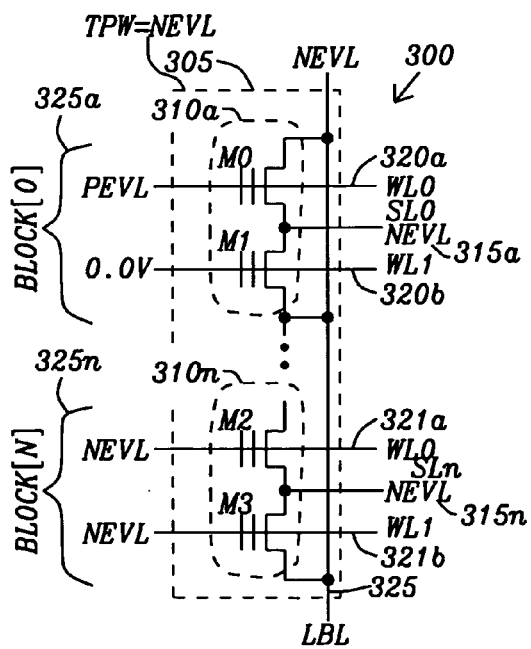
Figure 3B:
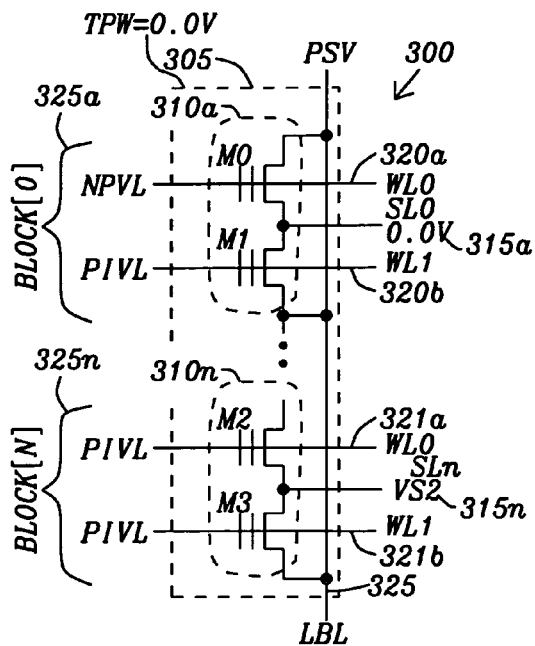

FIGS. 3a-3c are schematic diagrams of floating-gate transistor NMOS NOR flash cells illustrating the bias conditions for reading, programming and page erasing of a floating-gate transistor NMOS NOR flash cells embodying the principles of the present invention. The schematic diagrams of FIGS. 3a-3c represent a sector 300 of an array of NOR flash cells 310a, ..., 310n that include the NMOS floating gate transistors M0, M1 and M2, and M3. The NMOS NOR flash floating gate transistors M0, M1, M2, and M3 are arranged in rows and columns. The drains of the NMOS NOR flash floating gate transistors M0 and M1 are commonly connected to the local bit line LBL 325. The sources of the NMOS NOR flash floating gate transistors M0 and M1 are commonly connected to the source line SL0 315a. Similarly the drains of the NMOS NOR flash floating gate transistors M2, and M3 are commonly connected to the local bit line LBL 325. The sources of the NMOS NOR flash floating gate transistors M2 and M3 are commonly connected to the source line SLn 315n.

The control gate of the NMOS NOR flash floating gate transistor M0 of the block 310a is connected to the word line WL0 320a and the control gate of the NMOS NOR flash floating gate transistor M1 of the block 310a is connected to the word line WL1 320b. Similarly, the control gate of the NMOS NOR flash floating gate transistor M0 of the block 310n is connected to the word line WL0 321a and the control gate of the NMOS NOR flash floating gate transistor M1 of the block 310n is connected to the word line WL1 321b.

The illustrated sector 300 of the NMOS NOR flash floating gate transistors M0, M1, M2, and M3 are formed in a common P-type well 305. The word lines 320a, and 320b, and 321a, and 321b are connected to a row decoder that decodes a block and row address and applies the appropriate voltages to the word lines 320a, and 320b, and 321a, and 321b for reading, programming, and erasing the block 310a, ..., 310n. The source lines 315a, ..., 315n are connected to a source line decoder that decodes a block and row address and applies to the appropriate voltage levels to the source lines 315a, ..., 315n for reading, programming, and erasing the block. The bit line 325 is connected to a column decoder that decodes a column address and applies the appropriate biasing for reading, programming, and erasing a block.

FIG. 3a illustrates the biasing voltages for selecting the NMOS NOR flash floating gate transistor M0 of the block 310a for reading. The word line 320a connected to the selected page of the block 310a and containing the NMOS NOR flash floating gate transistor M0 is set to the voltage level of the word line read voltage VRWL or approximately the level of the power supply voltage source VDD. The unselected word line 320b of the selected block 310a and the word lines 321a and 321b of the unselected block 310n are set to the voltage level of the of the ground reference voltage level (0.0V). The source line 315a connected to the selected NMOS NOR flash floating gate transistor M0 is set to the voltage level of the ground reference voltage level (0.0V). The source line 315n that is connected to the unselected block 310n is set to a first source line inhibit biasing voltage VS1 of approximately +1.0V. The bit line LBL 325 is set to the read biasing drain voltage VRB of approximately +1.0V. The P-type well TPW 305 is set to the voltage level of the ground reference voltage source (0.0V). If the selected NMOS NOR flash floating gate transistor M0 of the block 310a is erased as a logical "1", the selected NMOS NOR flash floating gate transistor M0 will not turn on and a sense amplifier will detect the programmed level of the logical "1". Alternately, if the selected NMOS NOR flash floating gate transistor M0 of the block 310a is programmed with a logical "0", the selected NMOS NOR flash floating gate transistor M0 will turn on and a sense amplifier will detect the programmed level of the logical "0".

FIG. 3b illustrates the biasing voltages for selecting the NMOS NOR flash floating gate transistor M0 of the block 310a for programming. The word line 320a connected to the selected page of the block 310a and containing the NMOS NOR flash floating gate transistor M0 is set to the voltage level of the very high negative program voltage NPVL. The very high negative program voltage NPVL has a magnitude of from approximately −8.0V to approximately −10.0V. The P-type well TPW 305 is set to the voltage level of the ground reference voltage source (0.0V). The unselected word line 320b of the selected block 310a and the word lines 321a and 321b of the unselected block 310a are set to program inhibit voltage PIVL. The program inhibit voltage PIVL has a magnitude of approximately −2.0V. The source line 315a that is connected to the selected NMOS NOR flash floating gate transistor M0 is set to the voltage level of the ground reference voltage. The source line 315n that is connected to the unselected block 310n is set to a second source line inhibit biasing voltage VS2 that has a magnitude of from approximately +1.5V to approximately 1.8V. The bit line LBL 325 is set to the high program select voltage PSV. The high program select voltage PSV has a magnitude of approximately +5.0V. If the selected NMOS NOR flash floating gate transistor M0 is not to be programmed (i.e. remain erased), the bit line LBL 325 is set to the voltage level of the ground reference voltage to inhibit the programming of the NMOS NOR flash floating gate transistors that are to remain erased.

FIG. 3c illustrates the biasing voltages for selecting the NMOS NOR flash floating gate transistor M0 of the block 310a for page erasing. The word line 320a connected to the selected page to be erased of the block 310a and containing the NMOS NOR flash floating gate transistor M0 is set to the magnitude of the very high positive erase voltage PEVL. The positive erase voltage PEVL has a magnitude of from approximately +8.0V to approximately +10.0V. The P-type well TPW 305 is set to the voltage level of the very large negative erase voltage NEVL. The very large is negative erase voltage NEVL has a magnitude of from approximately −8.0V to approximately −10.0V. The unselected word line 320b of the selected block 310a is set to the ground reference voltage level to inhibit the unselected NMOS NOR flash floating gate transistor M1 of the block 310a from erasure. The word lines 321a and 321b of the unselected block 310n are coupled through the P-type well TPW to the very large negative erase voltage NEVL to inhibit erasure of the unselected block 310n. The source line 315a that is connected to the selected NMOS NOR flash floating gate transistor M0 and the source line 315n that is connected to the unselected block 310n is set to the very large negative erase voltage NEVL of from approximately −8.0V to approximately −10.0V. The bit line LBL 325 is set to the very large negative erase voltage NEVL. In this example only the page containing the NMOS NOR flash floating gate transistor M0 is erased and the unselected page containing the NMOS NOR flash floating gate transistor M1 of the selected block 310a and the unselected block 310n are inhibited from erasing.

Figure 4:
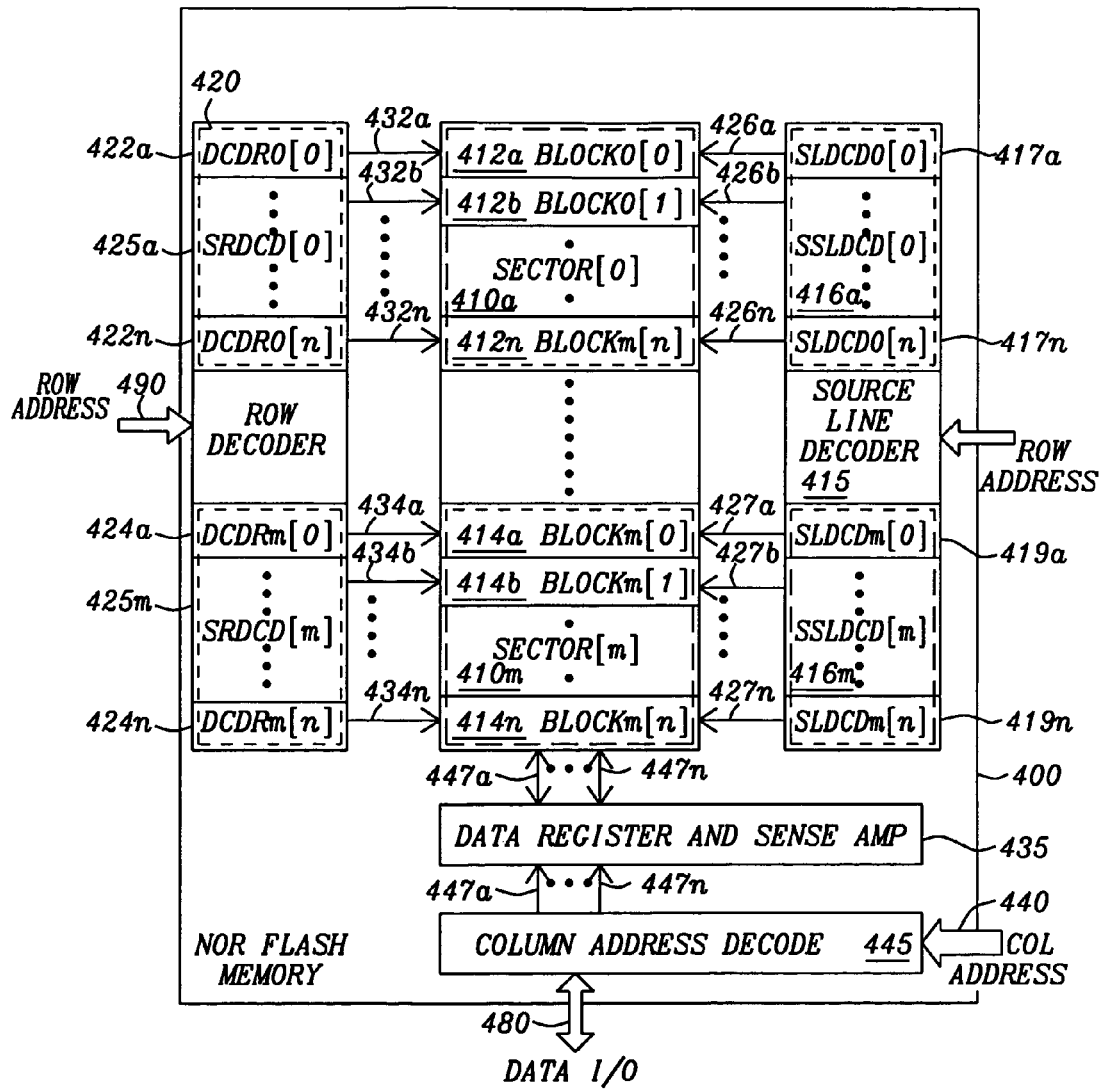
FIG. 4 is a block diagram of a nonvolatile memory device embodying the principles of the present invention.

FIG. 4 is a block diagram of a nonvolatile memory device 400 embodying the principles of the present invention incorporating the various embodiments of NOR flash floating-gate transistors. The NOR flash nonvolatile memory device 400 includes an array 405 of NMOS flash floating-gate transistors arranged in a matrix of rows and columns. The array 405 is partitioned into a uniform number of sectors 410a, ..., 410m and each sector is divided into a uniform number of blocks 412a, 412b, ..., 412n, and 414a, 414b, ..., 414n, For instance, a 1 Gb memory array device may be divided into 1024 sectors. Each sector then becomes 128 KB and may be divided into a number blocks such as 8 blocks of 16 KB each. Further, the block is divided into pages. In this example, the page may have a size of 4 Kb such that one page is equivalent to one word line or row of the block or sub-array 412a, 412b, ..., 412n, and 414a, 414b, 414n. Thus, each block 412a, 412b, ..., 412n, and 414a, 414b, ..., 414n has 32 pages or word lines.

The column address decoder 445 receives a column address 440, decodes the column address 440, and from the decoded column address 440 selects which one of the data registers & sense amplifiers 435 are being accessed. The column address decoder 445 activates the appropriate global bit lines 447a, ..., 447n is for operating a selected sector 410a, ..., 410m. The appropriate global bit lines 447a, ..., 447n are further connected to the data register and sense amplifier 435. The data register and sense amplifier 435 receives the data signals through the global bit lines 447a, ..., 447n from the selected sector 410a, ..., 410m and senses and holds the data from the data signal for a read operation. In a program operation, the data is transferred from the data register and sense amplifier 435 through the global bit lines 447a, ..., 447n to the selected sector 410a, ..., 410m. The data being read from or written (program and erase) to the array 405 of NOR NMOS flash floating-gate transistors is transferred to and from the data register and sense amplifier 435 through the column address decoder 445 from and to the data input/output bus 480.

Each block 412a, 412b, ..., 412n, and 414a, 414b, ..., 414n of the array 405 of NOR NMOS flash floating-gate transistors is connected to a row decoder 420 through the word lines 432a, 432b, 432n, 434a, 434b, 434n. Each sector 410a, ..., 410m is connected to a sector row decoder 425a, ..., 425m within the row decoder 420. Each sector 410a, ..., 410m is connected to one of the sector row decoder 425a, ..., 425m. The sector row decoders 425a, ..., 425m further incorporate block row decoders 422a, 422b, ..., 422n, and 424a, 424b, 424n such that each block 412a, 412b, ..., 412n, and 414a, 414b, ..., 414n is connected with its own block row decoder 422a, 422b, ..., 422n, and 424a, 424b, 424n for providing the appropriate voltage levels to a selected page or word line for reading and programming selected NMOS flash floating-gate transistors. The row address 490 are transferred to each of the row decoders 422a, 422b, ..., 422n, and 424a, 424b, 424n select the page or word line and to provide the appropriate voltage levels for reading and programming the selected NMOS flash floating gate transistors.

Each block 412a, 412b, ..., 412n, and 414a, 414b, ..., 414n of the array 405 of NMOS NOR flash floating-gate transistors is connected to a source line decoder 415 through the source lines 426a, 426b, 426n, 427a, 427b, 427n. The source line decoder 420 is formed of multiple sector source line decoders 416a, ..., 416m. Each sector source line decoder 416a, ..., 416m has multiple block source line decoders 417a, 417b, ..., 417n, and 419a, 419b, ..., 419n such that each block 412a, 412b, ..., 412n, and 414a, 414b, ..., 414n is connected with its own source line decoder 417a, 417b, ..., 417n, and 419a, 419b, ..., 419n for providing the appropriate voltage levels to a selected page or word line for reading and programming selected NMOS flash floating-gate transistors. The row address 490 is transferred to each of the source line decoders 417a, 417b, ..., 417n, and 419a, 419b, ..., 419n to select the source line of the selected page to provide the appropriate voltage levels for reading, programming, and erasing the selected NMOS flash floating gate transistors.

Figure 5:
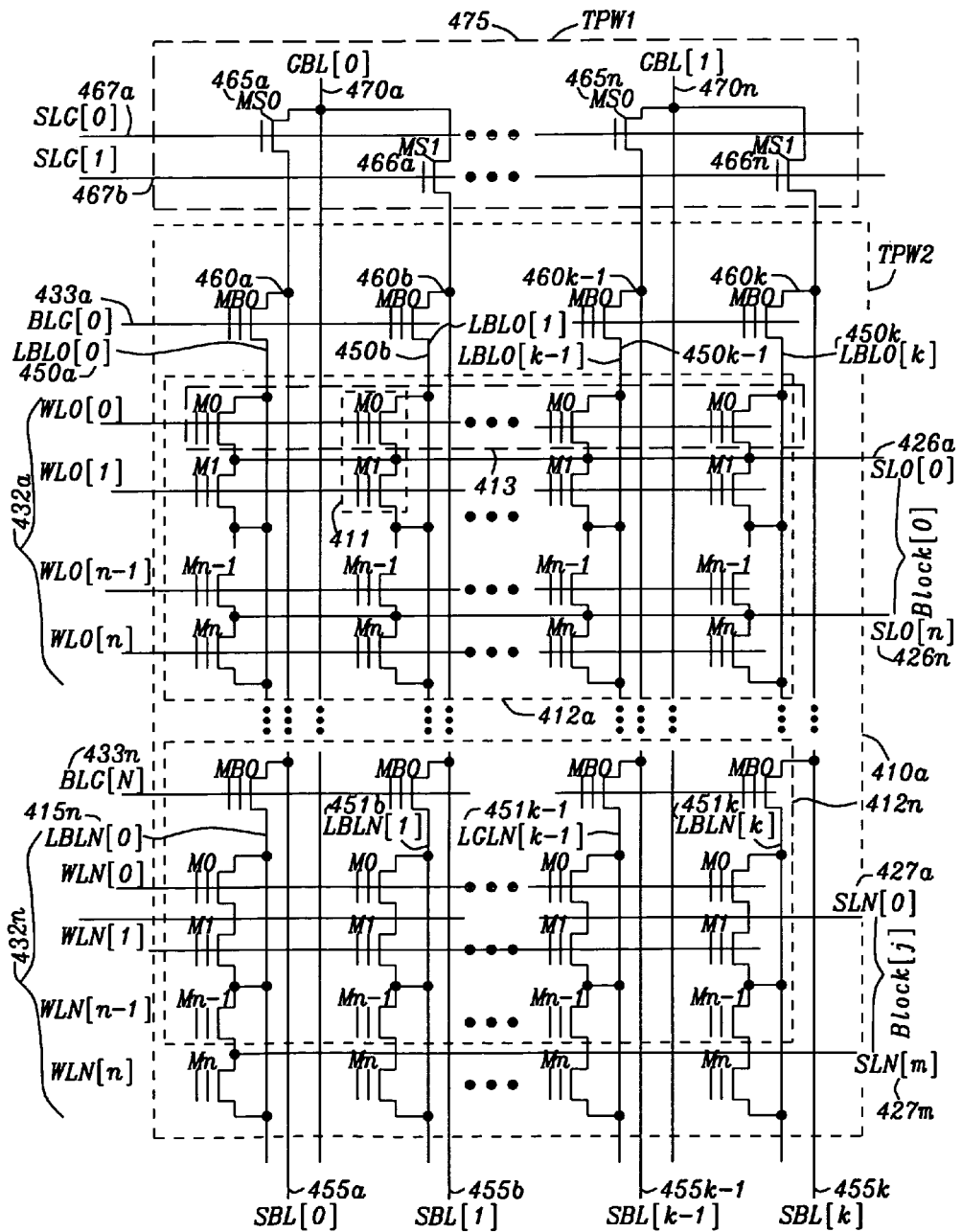
FIG. 5 is a schematic diagram illustrating an array of floating-gate transistor NMOS NOR flash cells. of FIG. 4 embodying the principles of the present invention.

Refer now to FIG. 5 for a discussion of the structure of a sector 410a of the array 405 of FIG. 4. The sector 410a is exemplary of the all the sectors 410a, ..., 410m of array 405. The sector 410a is placed in a common P-type well (TPW2) and contains all the NMOS floating gate transistors M0, ..., Mn of the sector 410a. The NMOS floating gate transistors M0, ..., Mn are arranged in rows and columns to form the sub-array of the sector 410a. The NMOS floating gate transistors M0, ..., Mn are formed pair-wise to create a NOR flash nonvolatile memory cell 411. The two NMOS floating gate transistors M0 and M1 of the NOR flash nonvolatile memory cell 411 have their drains commonly connected to a local bit line 450a, ..., 450k and 451a, ..., 451k. The sources of the two NMOS floating gate transistors M0 and M1 are connected to one source line 426a, ..., 426k and 427a, ..., 427k. The source lines 426a, ..., 426m and 427a, ..., 427m of each block 412a, ..., 412n are connected to the source line decoder 415 of FIG. 4 to receive the appropriate source biasing voltages for reading, programming, and erasing selected NMOS floating gate transistors M0, ..., Mn. The control gates of the two NMOS floating gate transistors M0 and M1 are connected to the word lines 432a, ..., 432n. The word lines 432a, ..., 432n are connected to the row decoder 420 of FIG. 4.

The sector 410a is divided into multiple blocks 412a, ..., 412n and each block 412a, ..., 412n is further divided into pages 413. The page 413 being a grouping of the NMOS floating gate transistors M0, ..., Mn having their control gates connected commonly to a word line (WL0) of the word lines 432a, ..., 432n. Each local bit line 450a, ..., 450k and 451a, ..., 451k is connected to the source of a block select floating gate transistor MB0 460a, ..., 460k. The drains of the block select floating gate transistors MB0 460a, ..., 460k are connected to the associated sector bit lines 455a, 455b, 455k. The gate of each of the select floating gate transistors MB0 460a, ..., 460k is connected to one of the block gate select lines 433a, 433n that provides the activation voltage to connect the NMOS floating gate transistors M0, ..., Mn to its associated sector bit line 455a, 455b, 455k.

Each of the sector bit lines 455a, 455b, 455k is connected to one of the sources of the global bit line gating transistors 465a, 465n and 466a, ..., 466n and each of the drains of the global bit line gating transistors 465a, 465n and 466a, ..., 466n is connected to one of the global bit lines 470a, ..., 470n. The gates of each of the global bit line gating transistors 465a, 465n and 466a, ..., 466n are connected to their associated global bit line select lines SLG[0] 467a and SLG

[1] 467b. The global bit lines 470a, ..., 470n are connected to the column address decoder 445 and the data register and sense amplifier 435.

When one row of the block select floating gate transistors MB0 460a, ..., 460k is activated one of the blocks 412a, ..., 412n is selected to be connected to the sector bit lines 455a, 455b, 455k. One of a pair of columns of the selected block 412a, ..., 412n is connected to the global bit lines when one grouping of the global bit line select lines SLG[0] 467a or SLG[1] 467b are activated to selectively turn on the global bit line gating transistors 465a, 465n and 466a, ..., 466n. In a read and a program operation, one of the global bit line gating transistors 465a, 465n and 466a, ..., 466n is activated at a time to read or program the one column of the NMOS floating gate transistors M0, ..., Mn follow deactivating the first of the global bit line gating transistors 465a, 465n and 466a, ..., 466n and activating the second of the global bit line gating transistors 465a, 465n and 466a, ..., 466n to read or program the second column of the NMOS floating gate transistors M0, ..., Mn.

Figure 6:
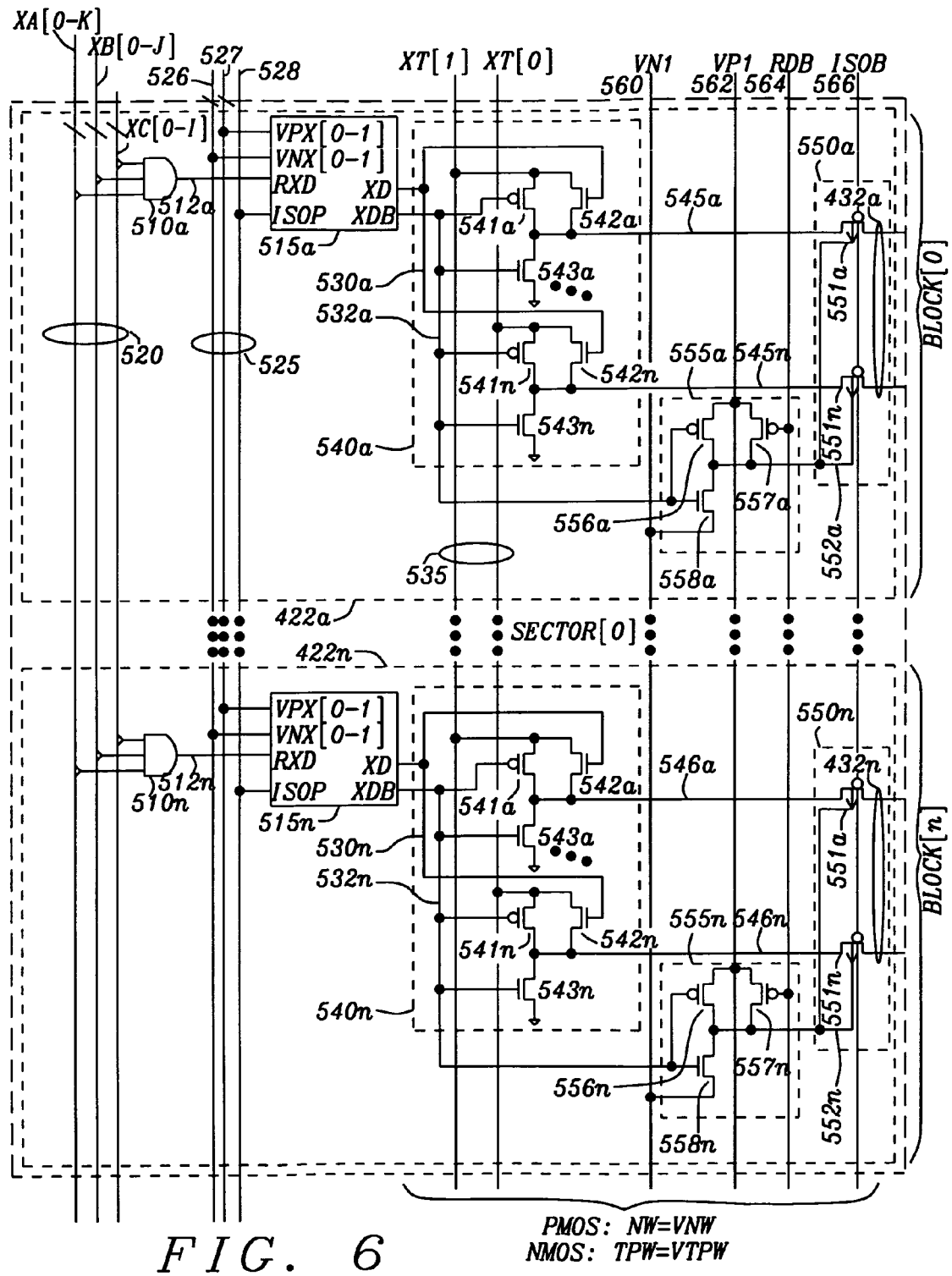
FIG. 6 is a schematic diagram of a block row decoder of the nonvolatile memory device of FIG. 4 embodying the principles of the present invention.

FIG. 6 is a schematic diagram of a representative sector decoder 425 of the nonvolatile memory device of FIG. 4. Each sector decoder 425 is partitioned into a number of block row decoders 422a, 422b, ..., 422n (Note that in FIG. 4, the row decoders are designated 422a, 422b, ..., 422n, and 424a, 424b, ..., 424n). The number of block row decoders 422a, 422b, ..., 422n in each sector decoder 425 is equal to the number of blocks of NMOS floating gate transistors M0, ..., Mn in each sector 410a, ..., 410m of FIG. 4. The logic gates 510a, ..., 510n (a NAND gate in this embodiment) receive the block address 520 of the row address 490 of FIG. 4, decodes the block address 520 to select which of the block row decoders 422a, ..., 422n are to be activated for reading, programming, or erasing. The output of each of the logic gates 510a, ..., 510n is the block select signal RXD [0] 512a, RXD [n] 512n that is the input to an input to one of the level shift circuits 515a, ..., 515n. The level shift circuits 515a, ..., 515n receive the power supply voltage levels 525 that are used to shift the lower voltage logic level of the block select signals RXD [0] 512a, RXD [n] 512n to the levels required for reading, programming, and erasing. The outputs of the level shift circuit 515a, ..., 515n are the high voltage block select signals XD 530a, ..., 530n and XDB 532a, ..., 532n that are applied to the row decode circuit 540a, ..., 540n.

The row decode circuits 540a, ..., 540n provide the appropriate voltage levels for transfer to the rows of the word lines 432a, ..., 432n of the selected block 412a, ..., 412n of FIG. 4. The voltage levels applied to row decode circuits 540a, ..., 540n are provided by the high voltage power supply voltage lines 535. Each of the high voltage power supply voltage lines 535 is associated with one of the word lines 432a, ..., 432n and is set according to the operation (read, program, erase, or verify) to be executed and are discussed hereinafter. The row decode circuits 540a, ..., 540n have the row pass devices formed of the high voltage PMOS transistors 541a, ..., 541n and the high voltage NMOS transistors 542a, ..., 442n connected pair-wise in parallel. The gates of the PMOS transistors 541a, ..., 541n are each connected to one of the high voltage out of phase block select signals XDB 532a, ..., 532n. and the gates of the NMOS transistors 542a, ..., 442n are each connected to one of the in-phase block select signals XD 530a, ..., 530n. The sources of the PMOS transistors 541a, ..., 541n and the drains of the PMOS transistors 541a, ..., 541n are connected to the high voltage power supply voltage line 535 associated with one of the word lines 432a, ..., 432n. The drains of the PMOS transistors 541a, ..., 541n and the sources of the PMOS to transistors 541a, ..., 541n are connected to the drain high voltage pass transistors 551a, ..., 551n associated with one of the word lines 432a, ..., 432n. The drains of the PMOS transistors 541a, ..., 541n and the sources of the PMOS transistors 541a, ..., 541n are further connected to the drain of the NMOS transistors 543a, ..., 543n. The gate of the NMOS transistors 543a, ..., 543n is connected to the out of phase block select signals XDB 532a, ..., 532n and the sources of the NMOS transistors 543a, ..., 543n are connected to the ground reference voltage source (0.0V). For the row decoders 422a, ..., 422n of the unselected block 412a, ..., 412n, the level shift circuits 515a, ..., 515n are deactivated and the out of phase block select signals XDB 532a, ..., 532n are set to turn on the NMOS transistors 543a, ..., 543n to set the drains of the NMOS transistors 543a, ..., 543n to the voltage level of the ground reference voltage source (0.0V).

The high voltage PMOS pass transistors 551a, ..., 551n form the PMOS high voltage isolators 550a, ..., 550n. The gates of the high voltage PMOS pass transistors 551a, ..., 551n are connected together and to the isolation signal ISOB 566. When activated, the high voltage pass transistors 551a, ..., 551n connect the word lines 432a, ..., 432n to the row decode circuits 540a, ..., 540n. When deactivated, the high voltage pass PMOS transistors 551a, ..., 551n isolate the word lines 432a, ..., 432n to the row decode circuits 540a, ..., 540n. It should be noted that the drain to source voltage of the transistors of the sector decoder never exceeds the +/−10V drain to source breakdown voltage.

The PMOS high voltage isolators 550a, ..., 550n are each formed in an independent N-type well. The N-type well for each of the PMOS high voltage isolators 550a, ..., 550n is connected to an N-type well switch 555a, ..., 555n through the control lines 552a, ..., 552n to individually charge or discharge the N-type wells. The N-type well switch 555a, ..., 555n includes the PMOS transistors 556a, ..., 556n and 557a, ..., 557n and the NMOS transistors 558a, ..., 558n. The gates of the PMOS transistors 556a, ..., 556n and the NMOS transistors 558a, ..., 558n are connected to the out of phase block select signals XDB 532a, ..., 532n. The gates of the PMOS transistors 557a, ..., 557n are connected to the out of phase read signal RDB 564. The drains the PMOS transistors 556a, ..., 556n and 557a, ..., 557n and drains the NMOS transistors 558a, ..., 558n are connected through the control lines 552a, ..., 552n to the N-type wells. The sources of the PMOS transistors 556a, ..., 556n and 557a, ..., 557n are connected to the positive N-well biasing voltage source VP1 562 and the sources of the NMOS transistors 558a, ..., 558n are connected to the negative N-well biasing voltage source VN1 560.

Figure 7:
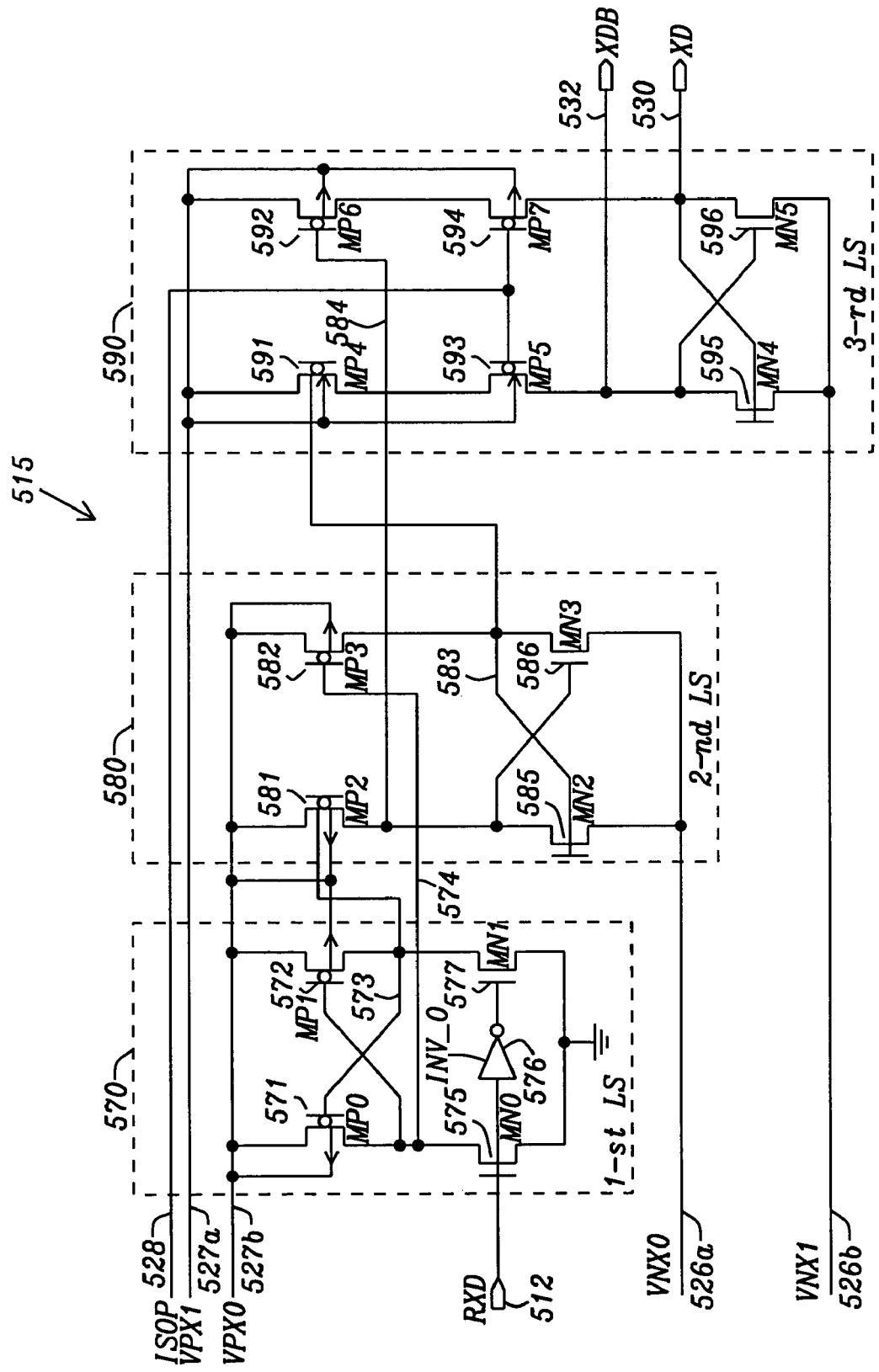
FIG. 7 is a schematic diagram of a level shifter circuit of the block row decoders of FIG. 6 embodying the principles of the present invention.

FIG. 7 is a schematic diagram of a level shifter circuit of the row decoder of FIG. 6. Referring now to FIG. 7, the level shifter circuit 515 includes three sub-level-shifter circuits 570, 580, and 590 to translate the low voltage level of the block select signal RXD 512 to a voltage level of a first positive high voltage power source VPX1 527a. The voltage translation maintains the drain to source breakdown voltage of the peripheral circuitry of the nonvolatile memory device 400 of FIG. 4 to be less than or equal to the drain to source breakdown voltage BVDSS approximately +/−10V. Maintaining the drain to source voltages of the sector decoder 425 of the nonvolatile memory device of FIG. 4 less than the +/−10V eliminates the need for special high voltage devices. The first level shift circuit 570 has pair of cross connected PMOS transistors 571 and 572 that have their sources connected to a second positive high voltage power source VPX0 527b. The bulk regions of the PMOS transistors 571 and 572 are connected to the second positive high voltage power source VPX0 527*b*. The drain of the PMOS transistor 571 is connected to the gate of the PMOS transistor 572 and the drain of the PMOS transistor 572 is connected to the gate of the PMOS transistor 571. The drain of the PMOS transistor 571 is connected to the drain of the NMOS transistor 575 and the drain of the PMOS transistor 572 is connected to the drain of the NMOS transistor 577. The gate of the NMOS transistor 575 is connected to receive the block select signal RXD 512. The block select signal RXD 512 is connected to the input of the inverter 576. The output of the inverter 576 is connected to the gate of the NMOS transistor 577. The sources of the NMOS transistors 575 and 577 are connected to the ground reference voltage source (0.0V).

The output nodes 573 and 574 of the first level shift circuit 570 are the input nodes of the second level shift circuit 580. The second level shift circuit 580 has pair of PMOS transistors 581 and 582 that have their sources connected to a second high voltage power supply VPX0 527*b*. The bulk regions of the PMOS transistors 581 and 582 are connected to the second high voltage power supply VPX0 527*b*. The drain of the PMOS transistor 581 is connected to the gate of the PMOS transistor 582 and the drain of the PMOS transistors 582 is connected to the gate of the PMOS transistors 581. The drain of the PMOS transistor 581 is connected to the drain of the NMOS transistor 585 and the drain of the PMOS transistor 582 is connected to the drain of the NMOS transistor 586. The output node 573 of the first level shift circuit 570 is connected to the gate of the PMOS transistor 581 and the output node 574 of the first level shift circuit 570 is connected to the gate of the PMOS transistor 582. The sources of the NMOS transistors are connected to the first negative high voltage source VNX0 526*a*. The output node 583 is at the junction of the connection of the drains of the PMOS transistor 582 and the NMOS transistor 586. The output node 584 is at the junction of the connection of the drains of the PMOS transistor 581 and the NMOS transistor 585.

The output nodes 583 and 584 of the second level shift circuit 580 are the input nodes of the third level shift circuit 590. The third level shift circuit 590 has pair of PMOS transistors 591 and 592 that have their sources connected to a second positive high voltage power supply VPX0 527*b*. The drain of the PMOS transistors 591 is connected to the source of the PMOS transistor 593. The drain of the PMOS transistors 592 is connected to the source of the PMOS transistor 594. The output node 583 of the second level shift circuit 580 is connected to the gate of the PMOS transistor 591 and the output node 584 of the second level shift circuit 580 is connected to the gate of the PMOS transistor 592. The gates of the PMOS transistors 593 and 594 are connected to the isolation signal ISOP 528. The isolation signal ISOP 528 is used to isolate the drain of PMOS transistors 591 and 592 from the in-phase high voltage block select signal XD 530 and the inverse high voltage block select signal XDB 532 at the program mode. If the PMOS transistors 593 and 594 were to be removed or eliminated, the voltage level of the power supply voltage source VDD would be applied to the output node 583 or the output node 584 during a program operation. This causes a voltage level of the power supply voltage source VDD plus the very high positive erase voltage to be applied from the gate to the drain of the PMOS transistors 591 or 592. The drain of the PMOS transistor 594 is connected to the drain of the NMOS transistor 596 and the gate of the NMOS transistor 595. The bulk regions of the PMOS transistors 591, 592, 593, and 595 are connected to the second high voltage power supply VPX1 527*a*. The sources of the NMOS transistors are connected to the second negative high voltage source VNX1 526*b*. The high voltage block select signal XD 530 is present at the junction of the connection of the drains of the PMOS transistor 594 and the NMOS transistor 596. The inverse high voltage block select signal XDB 532 is present at the junction of the connection of the drains of the PMOS transistor 593 and the NMOS transistor 595.

Figure 8:
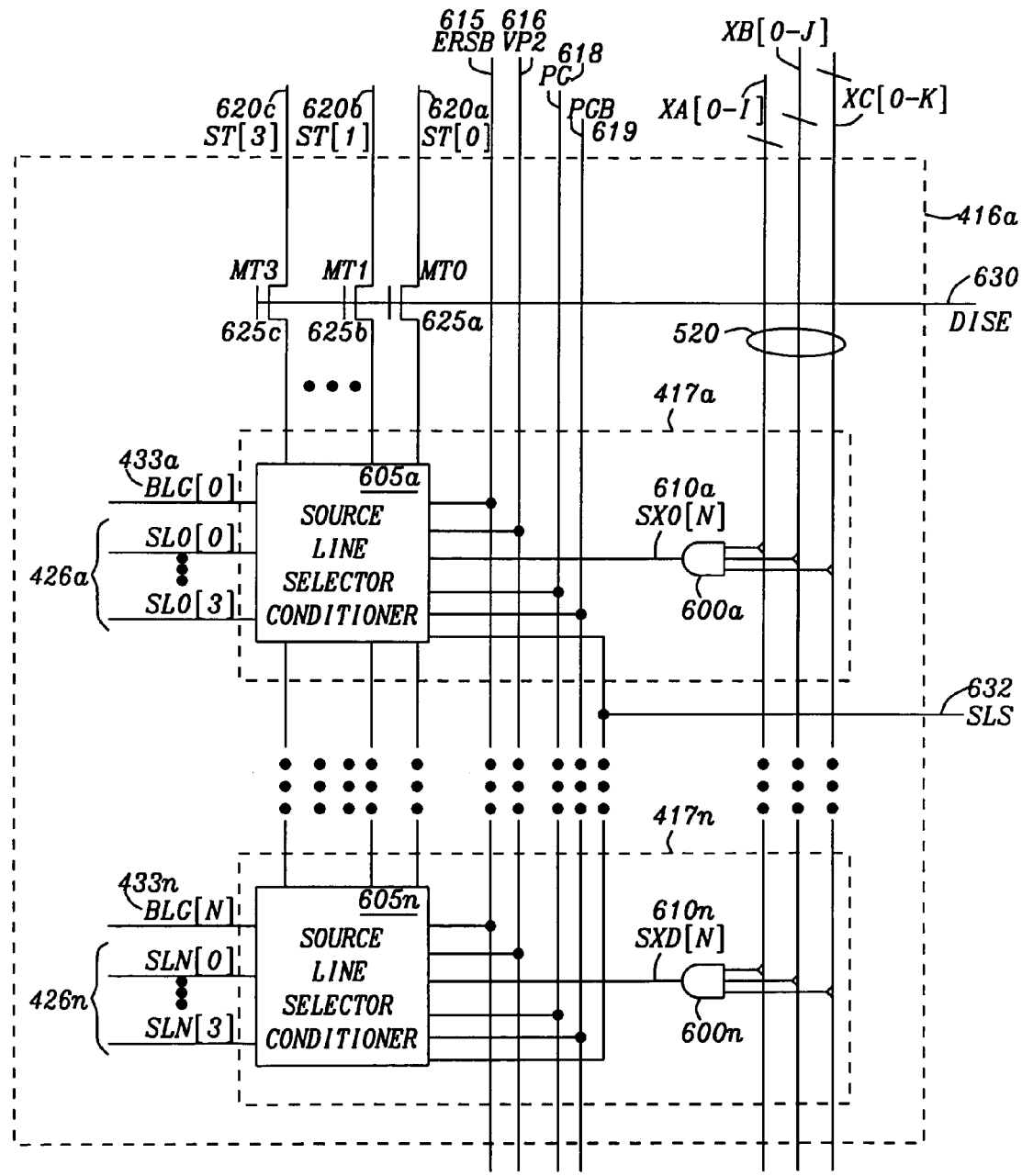
FIG. 8 is a schematic diagram of source line decoder of the nonvolatile memory device of FIG. 4 embodying the principles of the present invention.

FIG. 8 is a schematic diagram of sector source line decoder of the nonvolatile memory device of FIG. 4. The sector source line decoder 416*a* is divided into multiple block source line decoders 417*a*, . . . , 417*n*. Each of the block source line decoders 417*a*, . . . , 417*n* has a logic gate 600*a*, . . . , 600*n* (a NAND gate in this embodiment) that receives and decodes the block address 520 of the row address 490 of FIG. 4. The output of the block source line decoders 417*a*, . . . , 417*n* is the block source line selection signal 610*a*, . . . , 610*n* that is the input to the source line selector/conditioner 605*a*, . . . , 605*n*. The source line selector/conditioner 605*a*, . . . , 605*n* is connected to the source lines 426*a*, . . . , 426*n* to apply the correct voltage levels to the source lines 426*a*, . . . , 426*n* for reading, programming, and erasing the selected NMOS floating gate transistors M0, . . . , Mn. The source line selector/conditioner 605*a*, . . . , 605*n* is connected to the block gate select lines 433*a*, 433*n* to provide the activation signal for activating the block select floating gate transistor MB0 460*a*, . . . , 460*n* of FIG. 5 to connect the selected NMOS floating gate transistors M0, . . . , Mn to the associated sector bit lines 455*a*, 455*b*, 455*k*. The out-of-phase erase signal ERSB 615, positive high voltage source VP2 616, the in-phase program signal PG 618, and the out-of-phase program signal PGB 619 provide the activation signals for setting the appropriate voltage levels to the source lines 426*a*, . . . , 426*n* and the block gate select lines 433*a*, 433*n* from the source line address lines ST[0] 620*a*, ST[1] 620*b*, and ST[3] 620*c* and the source line select line SLS 632. The source line address lines ST[0] 620*a*, ST[1] 620*b*, and ST[3] 620*c* are connected to the drains of the NMOS transistors 625*a*, 625*b*, and 625*c*. The sources of the NMOS transistors 625*a*, 625*b*, and 625*c* are connected to the source line decoders 605*a*, . . . , 605*n*. The gates of the NMOS transistors 625*a*, 625*b*, and 625*c* are connected to the source line isolation signal DISE 630 to isolate the source line address lines ST[0] 620*a*, ST[1] 620*b*, and ST[3] 620*c* from the source line decoders 605*a*, . . . , 605*n* during an erase operation. The transistors of the source line decoders 605*a*, . . . , 605*n* are subject to drain to source voltage levels that are less than or equal to a drain to source breakdown voltage BVDSS of approximately +/−10V.

Figure 9:
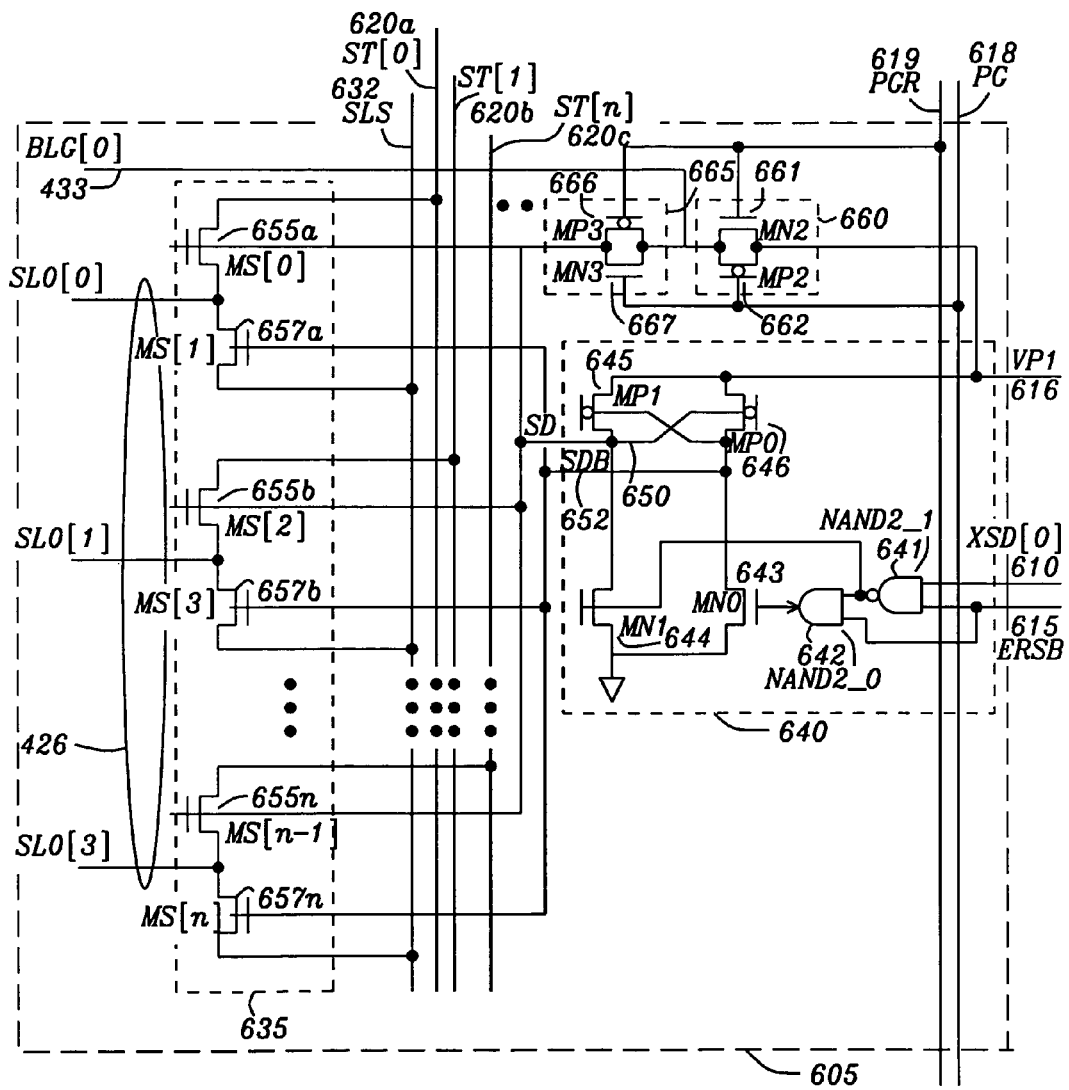
FIG. 9 is a schematic diagram of a source line selector/conditioner of the source line decoder of FIG. 8 embodying the principles of this invention.

FIG. 9 is a schematic diagram of a source line selector/conditioner of the source line decoder 605*a*, . . . , 605*n* of FIG. 8. The source line selector/conditioner 605 has a voltage level shifter 640 that receives the block selection signal 610 and translates the voltage level of the block selection signal 610 to those required by the source lines 426 and the block gate select signal 433. The voltage level shifter 640 has a logic gate 641 (a NAND circuit in this embodiment) that receives the block selection signal 610 and the out of phase of the erase command signal 615. The output of the logic gate 641 is an input to a logic gate 642 (a NAND circuit in this embodiment). The second input of the logic gate 642 is the erase command signal 615. The output of the logic gate 641 is connected to the input of the NMOS transistor 644. The output of the logic gate 642 is the input of the NMOS transistor 643. The sources of the NMOS transistors 643 and 644 are connected to the ground reference voltage source (0.0V). The drain of the NMOS transistor 643 is connected to the drain of the PMOS transistor 646 and the gate of the PMOS transistor 645. The drain of the NMOS transistor 644 is connected to the drain of the PMOS transistor 645 and the gate of the PMOS transistor 646. The sources of the PMOS transistors 645 and 646 are connected to the positive high voltage source VP2 616. The in-phase output SD 650 of the voltage level shifter 640 is generated at the junction of the connection of the drains of the NMOS transistor 644 and the PMOS transistor 645. The out-of-phase output SDB 652 of the voltage level shifter 640 is generated at the junction of the connection of the drains of the NMOS transistor 643 and the PMOS transistor 646.

The in-phase output SD 650 and out-of-phase output SDB 652 of the voltage level shifter 640 are connected to the inputs of the source line decoder 635. The source line decoder 635 is formed of pairs of NMOS transistors 655a, ..., 655n and 657a, ..., 657n. The gates of the NMOS transistors 655a, ..., 655n are connected to the in-phase output SD 650 of the voltage level shifter 640 and the gates of the NMOS transistors 657a, ..., 657n are connected to the out-of-phase output SDB 652 in-phase output SD 650. The sources of the NMOS transistors 655a, ..., 655n and the drains of the NMOS transistors 657a, ..., 657n are connected to the source lines 426. The drains of the NMOS transistors 655a, ..., 655n are connected to the source line address lines ST[0] 620a, ST[1] 620b, and ST[3] 620c. The sources of the NMOS transistors 657a, ..., 657n are connected to the source line select line SLS 632.

The in-phase program command signal PG 618 and the out-of-phase program command signal PGB 619 are connected to the pass gate circuits 660 and 665. The NMOS transistor 661 and the PMOS transistor 662 are placed in parallel to form the pass gate circuit 660 and the PMOS transistor 666 and the NMOS transistor 667 are placed in parallel to form the pass gate circuit 665. The out-of-phase program command signal PGB 619 is connected to the gates of the NMOS transistor 661 and the PMOS transistor 666 and the in-phase program command signal PG 618 is connected to the PMOS transistors 662 and 667. The sources of the NMOS transistor 661 and the PMOS transistor 662 are connected to the positive high voltage source VP2 616. The drains of the NMOS transistor 661 and the PMOS transistor 662 are connected to the sources of the PMOS transistor 666 and the NMOS transistor 667 and to the block gate select line 433 of each block to selectively activate the block select floating gate transistors MB0 460a, ..., 460n of FIG. 5. The sources of the PMOS transistor 666 and the NMOS transistor 667 are connected to the gates of the NMOS transistors 655a, ..., 655n to transfer the decoded in-phase output SD 650 to activate one of the NMOS transistors 655a, ..., 655n when the of the voltage level shifter 640 is active during a program operation.

Figure 10:
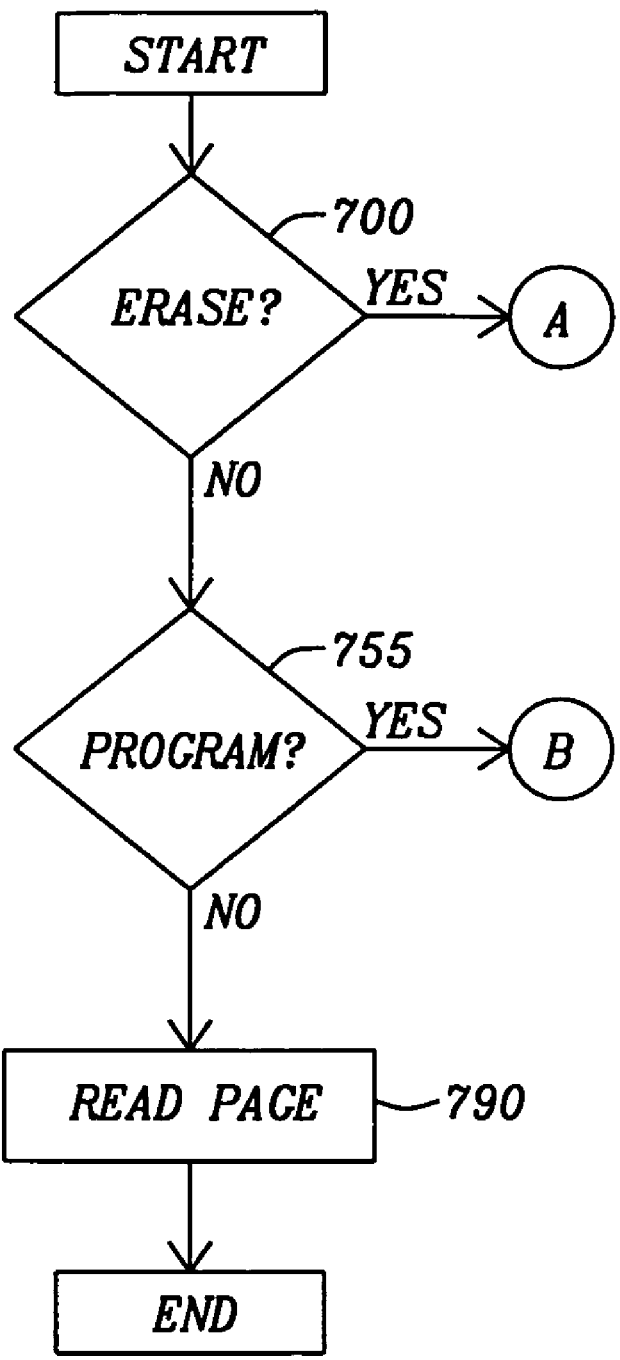
FIG. 10 is flow chart for the method for operating the nonvolatile memory device of FIG. 4.
Figure 11:
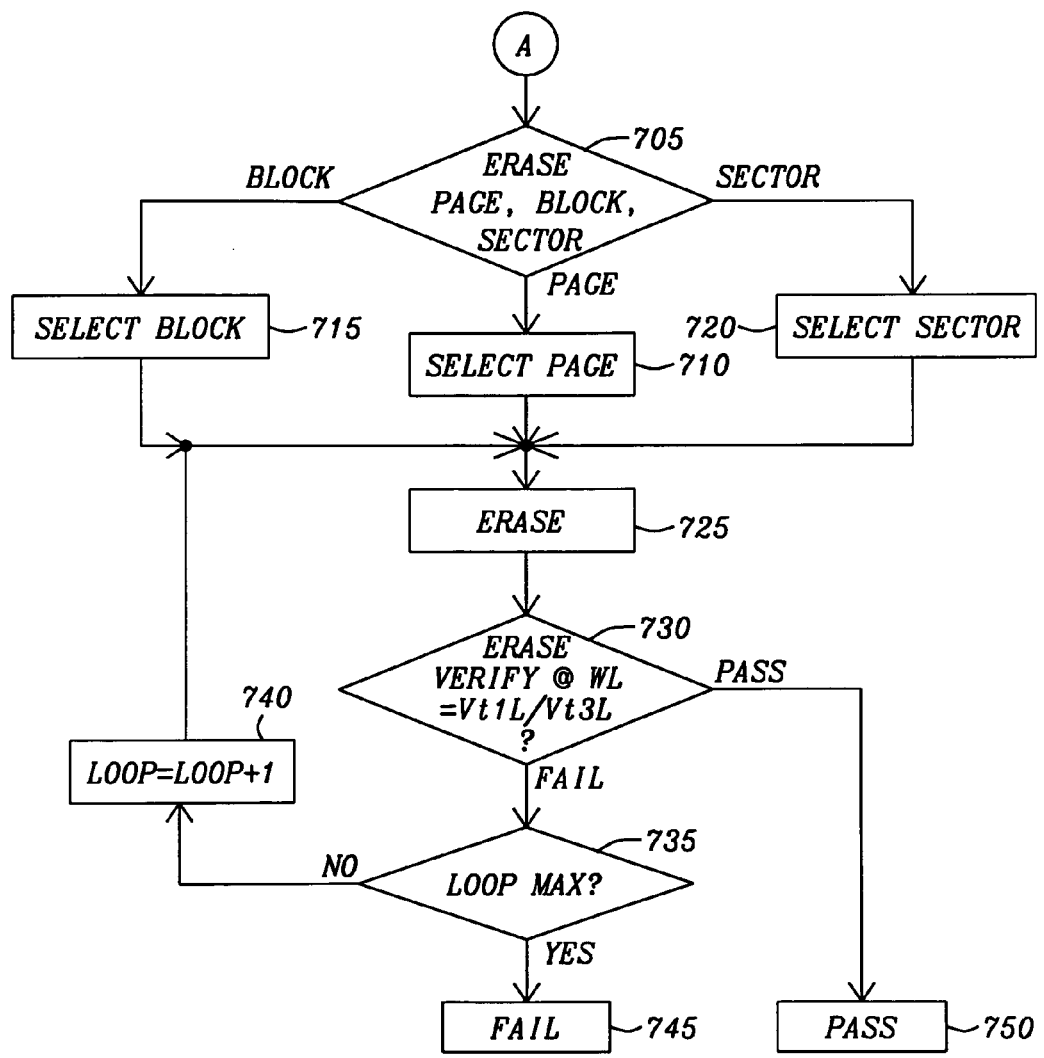
FIG. 11 is flow chart for the method for erasing and erase verifying a page, block, or sector of the nonvolatile memory device of FIG. 4.
Figure 12:
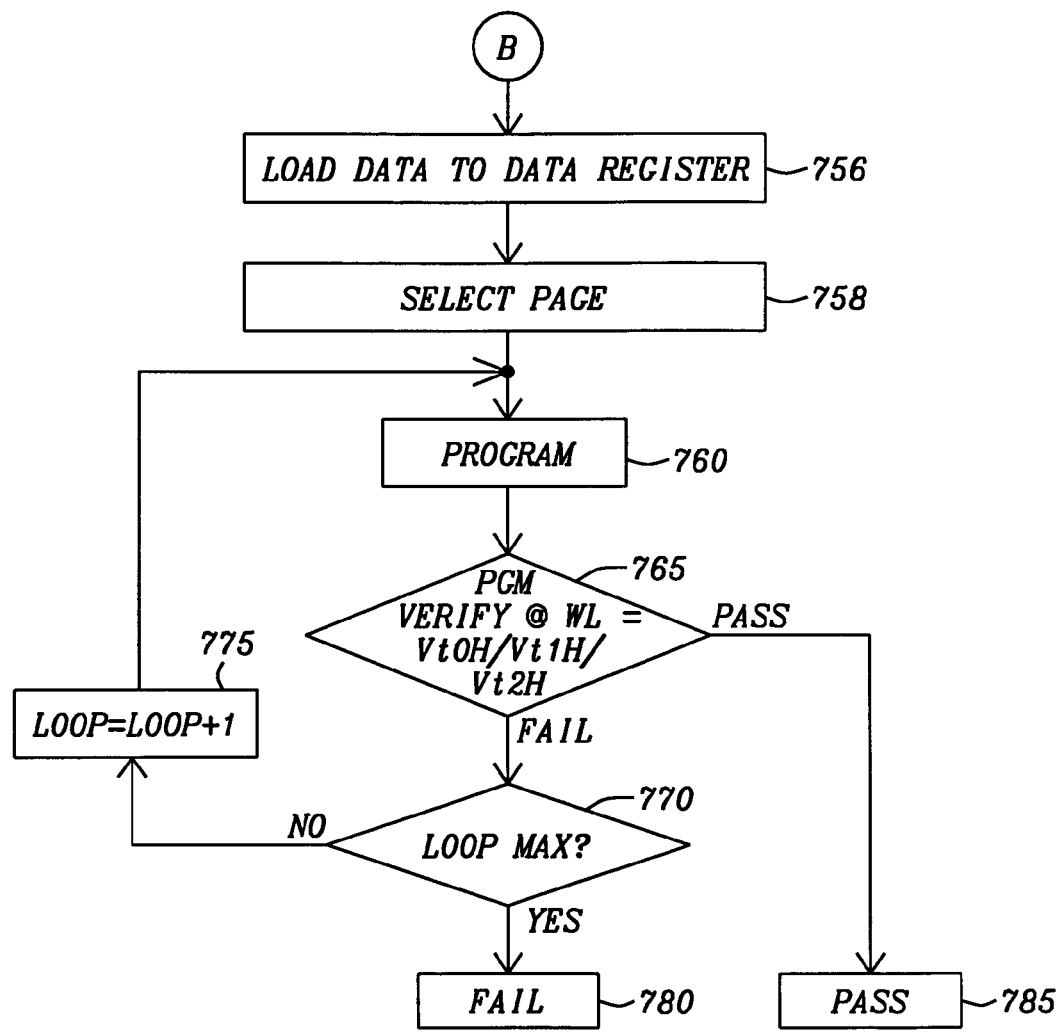
FIG. 12 is flow chart for the method for programming and program verifying a page of the nonvolatile memory device of FIG. 4.

FIG. 10 is flow chart for the method for operating the nonvolatile memory device of FIG. 4. FIG. 11 is flow chart of the method for erasing and erase verifying a page, block, or sector of the nonvolatile memory device of FIG. 4. FIG. 12 is flow chart of the method for programming and program verifying a page of the nonvolatile memory device of FIG. 4. Refer now to FIGS. 4-12, 13a, 13b, 14a, 14b, and 15 for a discussion of the operating voltage levels required for the reading, programming, erasing, and verification of the nonvolatile memory device. The method begins by determining (Box 700) if the operation is an erase. If the operation is an erase operation, the erase is determined (Box 705) to be a page, block, or sector erase. If the operation is to be a page erase, the page to be erased is selected (Box 710) and the page is erased (Box 725). The voltage levels for the array 405 of the NMOS floating gate transistors M0, ..., Mn are shown in FIG. 13a for a single level cell program and FIG. 13b for a multiple level cell program. For the page erase the voltage levels are the same for the single level cell program and the multiple level cell program. The word lines 432U of the unselected blocks 412U of the selected sectors have the very high negative erase voltage coupled from the P-type well TPW 244S of the selected sector. The very high negative erase voltage, as applied to the P-type well TPW 244S, is from approximately −8.0V to approximately −10.0V. In the unselected sectors 410a, ..., 410m of the array 405, the P-type well TPW 244U is set to approximately the voltage level of the ground reference voltage source (0.0V). The selected word line 432S of the selected block is set to a very high positive erase voltage. The very high positive erase voltage is from approximately +8.0V to approximately +10.0V. The unselected word line 432SU in the selected block 412S is set to the approximately the voltage level of the ground reference voltage source (0.0V). The selected local bit line 450S is set to the very high negative erase voltage. The block gate select lines 433S are set to the high erase select voltage of approximately +5.0V to couple the local bit line 450a, ..., 450k and 451a, ..., 451k to the associated sector bit lines 455a, 455b, 455k. The selected source line 426S are set to the very high negative erase voltage. The selected global bit line select lines 467S are set to the very high negative erase voltage to connect the sector bit lines 455a, 455b, 455k to the global bit lines 470a, ..., 470n.

To establish the page erase values as just described the row decoders 422a, 422b, ..., 422n, and 424a, 424b, 424n of the selected sector have voltage levels described in FIGS. 14a and 14b. The single level cell program signal of FIG. 14a and the multiple level cell program signals of FIG. 14b are identical for a page erase operation The selected word line 432S must be set to the very high positive erase voltage and the unselected word lines 432SU of the selected block are set to the approximately the voltage level of the ground reference voltage source (0.0V). The unselected word lines 432U of the unselected blocks are coupled to the very high negative erase voltage from the P-type well TPW 244S. To accomplish these levels, the row decoders 422a, 422b, ..., 422n of the selected blocks 412S have their selected high voltage power supply voltage line XT 535S associated with the selected word line 432S set to the very high positive erase voltage to be fed through the row decode circuit 540a, ..., 540n and the PMOS high voltage isolators 550a, ..., 550n to the selected word line 432. The unselected high voltage power supply voltage line 535U associated with the selected word line 432SU set to the voltage level of the ground reference voltage level to be fed through the row decode circuit 540a, ..., 540n and the PMOS high voltage isolators 550a, ..., 550n to the unselected word line 432SU. The voltage level of the selected in-phase block select signals XD 530S, indicating that a block 412S is selected, is set to the very high positive erase voltage and the voltage level of the out-of-phase block select signals XD 530U, indicating that a block 412U is unselected, is set to approximately the voltage level of the ground reference voltage source (0.0V) to be coupled from the row decode circuit 540a, ..., 540n through the PMOS high voltage isolators 550a, ..., 550n such that the unselected word lines 432U are coupled to the very high negative erase voltage from the P-type well TPW 244S. The N-type wells 552S of the selected block 412S are connected to the very high positive erase voltage to avoid voltage breakdown in the PMOS high voltage isolators 550a, ..., 550n and the N-type well switch 555a, ..., 555n. The N-type wells 552U of the selected block 412U are connected to the voltage level of the ground reference voltage source (0.0V).

To transfer the very high positive erase voltage present on the selected high voltage power supply voltage line XT 535S to the selected word line 432S, the PMOS high voltage isolators 550a, ..., 550n are activated with the isolation signal ISOB 566 is set to the voltage level of the ground reference voltage source (0.0V). The out of phase read signal RDB 564, first positive high voltage power source VPX1 527a, the second high voltage power source VPX0 527b, and the positive N-well biasing voltage source VP1 562 are set to the very high positive erase voltage to set the selected word line 432S to the voltage level of the very high positive erase voltage. The first high negative voltage source VNX0 526a, the second negative high voltage source VNX1 526b, the negative N-well biasing voltage source VN1 560 and isolation signal ISOP 528 are set to the voltage level of the ground reference voltage source (0.0V) to set the unselected word lines 432SU of the selected block 412S to approximately the voltage level of the ground reference voltage source (0.0V).

FIG. 15 illustrates the voltage levels of both the single level cell program and the multiple level cell program to generate the biasing voltages for the source lines for the page, block, or sector erase. In the erase operation for the page, block, sector all the source lines 426S, 426SU, and 426U are selected and set to the very high negative erase voltage level, because the very high negative erase voltage applied to the P-type well TPW 244S is transferred from source line select line SLS 632. All the source line address lines ST 620S and 620U are selected and set to approximately the voltage level of the ground reference voltage source (0.0V). All the block source line selection signals 610S and 610U are selected and set to the voltage level of the power supply voltage source VDD. All the block gate select lines BLG 433S and 433U are selected and set to approximately the voltage level of the ground reference voltage source (0.0V). The out of phase erase command signal 615, the positive high voltage source VP2 616, and the in-phase program command signal PG 618 are set to approximately the voltage level of the ground reference voltage source (0.0V). The source line select line SLS 632 and the source line erase isolation signal DISE 630 are set to the very high negative erase voltage level. The out-of-phase program command signal PGB 619 is set to the voltage level of the power supply voltage source. The very high negative erase voltage level as applied to the source line select line SLS 632 is fed to the selected source lines 426S, but to prevent the very high negative erase voltage level from passing to all the source lines 426U, 426SU, and 426U in a selected sector the source line address lines ST 620S, the NMOS transistors 625a, 625b, and 625c must be turned off. The source line erase isolation signal DISE 630 is set to the very high negative erase voltage level to turn off the NMOS transistors 625a, 625b, and 625c.

Returning now to FIG. 11, after the completion of the erase operation (Box 725), the page erase verify operation is executed (Box 730) to determine if the erase has been successfully accomplished. If the erase is not successful, a loop counter is to tested (Box 735) to assess that the maximum number of erasure trials is not exceeded. If the maximum number of erasure trials is not exceeded, the loop counter is incremented (Box 740) and the page erase operation is executed repetitively until the maximum number of erasure trials is exceeded and the nonvolatile memory device is declared as having failed (Box 745) or the erasure is a success and the nonvolatile memory device is declared as having successfully been erased (Box 750).

The voltage levels for the page erase verification for the array 405 of the NMOS floating gate transistors M0, ..., Mn are shown in FIG. 13a for a single level cell program and FIG. 13b for a multiple level cell program. Referring to FIGS. 13a and 13b, the unselected word lines 432U of the unselected blocks 412U and the unselected word lines 432SU of the selected blocks 412S are set to the voltage level of the ground reference voltage source (0.0V). The selected word line 432S is set to a voltage level of the lower boundary of the erase threshold voltage Vt1L or approximately +5.0V for the single level cell program as shown in FIG. 13a. The selected word line 432S is set to a voltage level of the lower boundary of the erase threshold voltage Vt3L or approximately +5.0V for the multiple level cell program as shown in FIG. 13b.

Referring to FIGS. 14a and 14b, the selected word line 432S is set to the lower boundary of the erase threshold voltage Vt1L by setting selected high voltage power supply voltage line XT 535S to the voltage level of the lower boundary of the erase threshold voltage level. The voltage level of the selected in-phase block select signals XD 530S, the first positive high voltage power source VPX1 527a, the second high voltage power source VPX0 527b, negative N-well biasing voltage source VN1 560, and the positive N-well biasing voltage source VP1 562 are set to lower boundary of the erase threshold voltage Vt1L to pass the lower boundary of the erase threshold voltage Vt1L to the selected word line 432S. The out of phase read signal RDB 564, the first high negative voltage source VNX0 526a, the second negative high voltage source VNX1 526b, and the isolation signal ISOP 528 are set to the voltage level of the ground reference voltage source (0.0V). These voltage levels, as described, pass the lower boundary of the erase threshold voltage Vt1L from the selected high voltage power supply voltage line XT 535S to the selected word line 432S. Further, the voltage levels, as described, pass the voltage level of the ground reference voltage source (0.0V) from the unselected high voltage power supply voltage line XT 535U to the unselected word line 432U.

The local bit lines 450a, ..., 450k and 451a, ..., 451k as shown in FIG. 5 are selectively connected to the associated sector bit lines 455a, 455b, 455k. Two of the sector bit lines 455a, 455b, 455k are selectively connected to one of the global bit lines 470a, ..., 470n. The local bit line 450a, ..., 450k and 451a, ..., 451k of one column is read or verified followed by reading the second local bit line 450a, ..., 450k and 451a, ..., 451k of the adjacent associated column. To accomplish this, the selected bit lines LBL 450S for the column being read is pre-charged to the pre-charge voltage level of the power supply voltage source VDD less the threshold voltage Vt (VDD−Vt) for sensing the status of the selected NMOS floating gate transistors M0, ..., Mn on the activated column. The pre-charge voltage level (VDD−Vt) will be discharged to 0V when the NMOS floating gate transistor M0, ..., Mn has not been successfully erased. If the NMOS floating gate transistors M0, ..., Mn are erased, the pre-charged level will be maintained. Since all the local bit lines 450a, ..., 450k and 451a, ..., 451k are tested during the erase verify operation, there are no unselected local bit lines 450U. The selected block gate select lines 433S for all the blocks of the selected sector are set to the voltage level of the high read select voltage HV" of approximately +5.0V to fully couple the local bit line 450a, ..., 450k and 451a, ..., 451k to the associated sector bit lines 455a, 455b, ..., 455k.

The selected source line 426S in the selected sector 412S are set to the voltage level of the ground reference voltage source (0.0V). The unselected source lines 426U is set first read inhibit voltage is approximately +1.0V. The selected global bit line select line 467S of the selected sector 4105 are set to the voltage level of the power supply voltage source VDD to connect a first set of sector bit lines 455a, 455b, ..., 455k to the associated global bit lines 470a, ..., 470n. The unselected global bit line select line 467U of the selected sector 410S are set to the voltage level of the power supply voltage source VDD to disconnect a second set of sector bit lines 455a, 455b, ..., 455k from the associated global bit lines 470a, ..., 470n. The P-type well TPW 244S selected sector 410S and the P-type well TPW 244U unselected sectors 410U are set to the voltage level of the ground reference voltage source (0.0V).

To establish the voltage levels as described for the erase verification in FIGS. 13a and 13b, the source line decoder 415 has the voltage levels shown in FIG. 15. Referring to FIG. 15, the selected source line 426S is set to the voltage level of the is ground reference voltage source (0.0V) and the unselected source lines 426SU and 426U are set to the first read inhibit voltage VS1*(approximately +1.0V). Further, the selected block gate select line 433S and the unselected block gate select lines 433U are to be set to the voltage level of the high source line select voltage HV" (approximately +5.0V). To accomplish these voltage levels, the selected source line address line ST 620S for the selected source line 426S is set to the voltage level of the ground reference voltage source (0.0V) and the unselected source line address line ST 620U is set to the first read inhibit voltage VS1*. The selected block source line selection signal SXD 610S is set to the voltage level of the power supply voltage source VDD and the unselected block source line selection signal SXD 610U is set to the voltage level of the ground reference voltage source (0.0V). The out of phase erase command signal ERSB 615 is set to the voltage level of the power supply voltage source VDD. The positive high voltage source VP2 616 and the out-of-phase program command signal PGB 619 are set to voltage level of the high source line select voltage HV". The source line select line SLS 632 is set to the voltage level of the first read inhibit voltage VS1*. The source line erase isolation signal DISE 630 is set to the voltage level of the power supply voltage source VDD. The in-phase program command signal PG 618 is set to approximately the voltage level of the ground reference voltage source (0.0V).

Return now to FIG. 11. If the operation is to be a block erase, the block to be erased is selected (Box 715) and the block is erased (Box 725). Referring now to FIGS. 14a and 14b, the voltage levels for the block erase are identical to that of the page erase described above except that there are no unselected word lines 432SU in the selected block 412S. All the word lines 432S are now selected for erasure and placed at the very high positive erase voltage level of from approximately +8.0V to approximately +10.0V to accomplish the block erase.

Returning now to FIG. 11, after the completion of the erase operation (Box 725), the block erase verify operation is executed (Box 730) to determine if the erase has been successfully accomplished. The block erase verify is identical to the page erase verify, except, again, there are no unselected word lines 432U. The selected word lines 432S are set to a voltage level of the lower boundary of the erase threshold is voltage Vt1L or approximately +5.0V for the single level cell program as shown in FIG. 13a. The selected word lines 432S are set to a voltage level of the lower boundary of the erase threshold voltage Vt3L or approximately +5.0V for the multiple level cell program as shown in FIG. 13b.

Returning to FIG. 11, if the block erase is not successful, a loop counter is tested (Box 735) to assess that the maximum number of erasure trials is not exceeded. If the maximum number of erasure trials is not exceeded, the loop counter is incremented (Box 740) and the page erase operation is executed repetitively until the maximum number of erasure trials is exceeded and the nonvolatile memory device is declared as having failed (Box 745) or the erasure is a success and the nonvolatile memory device is declared as having successfully been erased (Box 750).

Return now to FIG. 11. If the operation is to be a sector erase, the sector to be erased is selected (Box 715) and the sector is erased (Box 725). Referring now to FIGS. 14a and 14b, the voltage levels for the sector erase are identical to that of the page erase and block erase described above except that there are no unselected word lines 432SU or 432U. All the word lines 432S are now selected for erasure and placed at the very high positive erase voltage level of from approximately +8.0V to approximately +10.0V to accomplish the sector erase.

Returning now to FIG. 11, after the completion of the erase operation (Box 725), the sector erase verify operation is executed (Box 730) to determine if the erase has been successfully accomplished. The sector erase verify is identical to the page erase verify, except, again, there are no unselected word lines 432SU or 432U. All the selected word lines 432S are set to a voltage level of the lower boundary of the erase threshold voltage Vt1L or approximately +5.0V for the single level cell program as shown in FIG. 13a. The selected word lines 432S are set to a voltage level of the lower boundary of the erase threshold voltage Vt3L or approximately +6.0V for the multiple level cell program as shown in FIG. 13b. Returning to FIG. 11, if the sector erase is not successful, a loop counter is tested (Box 735) to assess that the maximum number of erasure trials is not exceeded. If the maximum number of erasure trials is not exceeded, the loop counter is incremented (Box 740) and the page erase operation is executed repetitively until the maximum number of erasure trials is exceeded and the nonvolatile memory device is declared as having failed (Box 745) or the erasure is a success and the nonvolatile memory device is declared as having successfully been erased (Box 750).

Returning now to FIG. 10, if the operation is determined (Box 700) not to be an erase operation, the operation is determine (Box 755) if it is a program operation. If the operation is determined (Box 755) to be a program operation (referring to FIG. 12), data is loaded (Box 756) to the data register and sense amplifier 435 and the page to be programmed is selected (Box 758). The selected page is then programmed (Box 760) with the voltage levels applied as shown in FIGS. 13a, 13b, 14a, 14b, and 15. Referring to FIGS. 13a and 13b, the unselected word lines 432U of the unselected blocks 412U and the unselected word lines 432SU of the selected block 412S are set to the negative program inhibit voltage that is approximately −2.0V. The selected word line 432S is set to the high negative program voltage level that is from approximately −8.0V to approximately −10. The high negative program voltage level is less than or equal to the drain to source breakdown voltage BVDSS of approximately 10V for the transistors of the row decoder 420 of FIG. 4. The selected local bit lines LBL 450S for the columns that are to be programmed are set to the high program voltage that is approximately +5.0V for the single level program cell (FIG. 13a). The selected local bit lines LBL 450S for the columns that are to be programmed are set to one of the program voltages that establish the desired threshold voltage representing the data to be programmed. The program voltages, as shown in FIG. 13b, are approximately +4.0V for the first level programmed threshold voltage Vt2, approximately +5.0V for the first level programmed threshold voltage Vt1, and approximately +6.0V for the first level programmed threshold voltage Vt0. The unselected local bit lines LBL 450U and the program inhibit of the selected local bit lines LBL 450S for the columns that are to remain erased are set to a voltage level of approximately the ground reference voltage source (0.0V) or alternately disconnected and allowed to float. To insure that the program voltages are passed from the column address decoder 445 to the global bit lines 447a, ..., 447n to the sector bit lines 455a, 455b, 455k to the local bit line 450a, ..., 450k and 451a, ..., 451k, the is selected block gate select line 433S for the selected block 412S and the sector gate select line 467S for the selected sector 410S is set to the high program select voltage that is from approximately +8.0V to approximately +10.0V. The unselected block select gate lines 433U for the unselected blocks 412U and the unselected sector gate select lines 467U for the unselected sectors 410U are set to the voltage level of the ground reference voltage source. The selected source line 426S connected to the selected page of the selected block 412S is set to the voltage level of the ground reference voltage source. The unselected source lines 426U of the selected sector 410S are set to the source line program inhibit voltage that is from approximately +1.5V to approximately 1.8V. The selected P-type well TPW 244S in which the selected sector 410S is formed and the unselected P-type wells TPW 244U in which the unselected sectors 410U are formed are set to the voltage level of the ground reference voltage source.

To establish the voltage level as described for the programming in FIGS. 13a and 13b, the row decoder 420 has the voltage levels shown in FIGS. 14a and 14b. To have the selected word line 432S set to the high negative program voltage, the selected high voltage power supply voltage line XT 535S associated with the selected word line 432S set to the very high negative program voltage. To have the unselected word lines 432SU and 432U set to the negative program inhibit voltage that is approximately −2.0V, the unselected high voltage power supply voltage line XT 535U associated with the unselected word lines 432U set to the negative program inhibit voltage. The voltage level of the selected in-phase block select signals XD 530S, indicating that a block 412S is selected is set to approximately the voltage level of the ground reference voltage source (0.0V) such that the very high negative program voltage is coupled from the row decode circuit 540a, ..., 540n through the PMOS high voltage isolators 550a, ..., 550n to the selected word line 432S. The voltage level of the out-of-phase block select signals XD 530U, indicating that a block 412U is unselected, is set to the very high negative program voltage to couple the negative program inhibit voltage to the unselected high voltage power supply voltage line XT 535U to the unselected word line 432SU and 432U. The N-type wells 552S of the selected block 412S and the N-type wells 552U of the unselected blocks 412U is connected to the voltage level of approximately the ground reference voltage source (0.0V).

To establish the voltage level as described for the programming in FIGS. 13a and 13b, the source line decoder 415 has the voltage levels shown in FIG. 15. Referring to FIG. 15, the selected source line 426S is set to the voltage level of the ground reference voltage source (0.0V) or disconnected and allowed to float. The unselected source lines 426SU and 426U are set to the source line program inhibit voltage VS2 that is from approximately +1.5V to approximately 1.8V. Further, the selected block gate select lines 433S is to be set to the voltage level of very high program voltage and the unselected block gate select lines 433U** is to be set to the voltage level of approximately the ground reference voltage source (0.0V).

To accomplish these voltage levels, the selected source line address line ST 620S for the selected source line 426S is set to the voltage level of the ground reference voltage source (0.0V) or disconnected and allowed to float. The unselected source line address line ST 620U is set to the source line inhibit voltage VS2. The selected block source line selection signal SXD 610S is set to the voltage level of the power supply voltage source VDD and the unselected block source line selection signal SXD 610U is set to the voltage level of the ground reference voltage source (0.0V). The out of phase erase command signal ERSB 615 is set to the voltage level of the power supply voltage source VDD. The positive high voltage source VP2 616 and the in-phase program command signal PG 618 are set to the very high program voltage. The source line select line SLS 632 is set to the voltage level of the source line program inhibit voltage VS2. The source line erase isolation signal DISE 630 is set to the voltage level of the high program select voltage that is approximately +5.0V. The out-of-phase program command signal PGB 619 is set to approximately the voltage level of the ground reference voltage source (0.0V).

Returning now to FIG. 11, after the completion of the program operation (Box 760), the page program verify operation is executed (Box 765) to determine if the program has been successfully accomplished. If the program is not successful, a loop counter is tested (Box 770) to assess that the maximum number of program trials is not exceeded. If the maximum number of program trials is not exceeded, the loop counter is incremented (Box 775) and the page program operation is executed repetitively until the maximum number of program trials is exceeded and the nonvolatile memory device is declared as having failed (Box 780) or the programming is a success and the nonvolatile memory device is declared as having successfully been erased (Box 785).

The program verify (Box 765) is essentially the same as the erase verify (Box 730) of FIG. 11 except the selected word line 432S of the single level program cell of FIG. 13a is set to the upper boundary of the threshold voltage Vt0H to evaluate the programmed threshold voltage of the selected NMOS floating gate transistors M0, ..., Mn. In the case of the multiple level program cell of FIG. 13b, selected word line 432S is iteratively set to the upper boundary of the first threshold voltage Vt0H, second threshold voltage Vt1H, and the third threshold voltage Vt2H to evaluate the programmed threshold voltage of the selected NMOS floating gate transistors M0, ..., Mn.

Returning now to FIG. 10, if the operation is determined (Box 755) not to be a program operation, the operation is a read operation and the read operation is executed (Box 790). The selected page is then read with the voltage levels applied as shown in FIGS. 13a, 13b, 14a, 14b, and 15. Referring to FIGS. 13a and 13b, the unselected word lines 432U of the unselected blocks 412U and the unselected word lines 432SU of the selected block 432S are voltage level of the ground reference voltage source (0.0V). The selected word line 412S is set to the voltage level of the power supply voltage source VDD. The selected local bit lines LBL 450S for the columns that are to be read are set to the first read biasing voltage of approximately +1.0V for the single level program cell (FIG. 13a) and the multiple level program cell (FIG. 13b). The unselected local bit lines LBL 450U for the columns that are set to a voltage level of approximately the ground reference voltage source (0.0V). To insure that the voltages are passed from the column address decoder 445 to the global bit lines 447a, ..., 447n to the sector bit lines 455a, 455b, 455k to the local bit line 450a, ..., 450k and 451a, ..., 451k, the selected block gate select line 433S for the selected block 412S is set to the high read select voltage HV" of approximately +5.0V to fully couple the local bit line 450a, ..., 450k and 451a, ..., 451k to the associated sector bit lines 455a, 455b, 455k. The sector gate select line 467S for the selected sector 410S is set to voltage level of the power supply voltage source VDD. The unselected sector gate select lines 467U for the unselected sectors 410U are set to the voltage level of the ground reference voltage source. The selected source line 426S connected to the selected page of the selected block 412S is set to the voltage level of the ground reference voltage source. The unselected source lines 426U of the selected block 412S is set to the source line read inhibit voltage that is approximately +1.0V. The selected P-type well TPW 244S in which the selected sector is formed and the unselected P-type wells TPW 244U in which the unselected sectors are formed are set to the voltage level of the ground reference voltage source.

To establish the read voltages of FIGS. 13a and 13b (referring to FIGS. 14a and 14b), the selected word line 432S is set to the voltage level of the power supply voltage source VDD by setting selected high voltage power supply voltage line XT 535S to the voltage level of the voltage level of the power supply voltage source VDD. The voltage level of the selected in-phase block select signals XD 530S, the first positive high voltage power source VPX1 527a, the second high voltage power source VPX0 527b, negative N-well biasing voltage source VN1 560, and the positive N-well biasing voltage source VP1 562 are set to the voltage level of the power supply voltage source VDD to pass the voltage level of the power supply voltage source VDD to the selected word line 432S. The out of phase read signal RDB 564, the first high negative voltage source VNX0 526a, the second negative high voltage source VNX1 526b, and the isolation signal ISOP 528 are set to the voltage level of the ground reference voltage source (0.0V). These voltage levels, as described, pass the voltage level of the power supply voltage source VDD from the selected high voltage power supply voltage line XT 535S to the selected word line 432S. Further, The voltage levels, as described, pass the voltage level of the ground reference voltage source (0.0V) from the unselected high voltage power supply voltage line XT 535U to the unselected word line 432U.

The local bit lines 450a, ..., 450k and 451a, ..., 451k as shown in FIG. 5 are selectively connected to the associated sector bit lines 455a, 455b, 455k. Two of the sector bit lines 455a, 455b, 455k are selectively connected to one of the global bit lines 470a, ..., 470n. The local bit line 450a, ..., 450k and 451a, ..., 451k of one column is read or verified followed by reading the second local bit line 450a, ..., 450k and 451a, ..., 451k of the adjacent associated column. To accomplish this, the selected bit lines LBL 450S for the column being read is set to the voltage level of the read sense voltage that is approximately +1.0V for sensing the status of the selected NMOS floating gate transistors M0, ..., Mn on the activated column. The unselected bit lines LBL 450U for the column not being read is set to the voltage level of the ground reference voltage source (0.0V) to disable the column not being read. The selected block gate select line 433S and the unselected block gate select line 433U for the selected sector is set to the voltage level of the high read select voltage HV" of approximately +5.0V to fully couple the local bit line 450a, ..., 450k and 451a, ..., 451k to the associated sector bit lines 455a, 455b, 455k.

The selected source line 426S in the selected sector 412S are set to the voltage level of the ground reference voltage source (0.0V). The unselected source lines 426U is set to the first read inhibit voltage that is approximately +1.0V. The selected global bit line select line 467S of the selected sector 410S are set to the voltage level of the power supply voltage source VDD to connect a first set of sector bit lines 455a, 455b, 455k to the associated global bit lines 470a, ..., 470n. The unselected global bit line select lines 467U of the selected sector 410S are set to the voltage level of the ground reference voltage source (0.0V) to disconnect a second set of sector bit lines 455a, 455b, 455k from the associated global bit lines 470a, ..., 470n. For the read and program verify operations, the enabled global bit line select lines SLG[0] 467a and SLG[1] 467b will determine the sequence (order) of the reading or verifying of the adjacent columns of the NMOS floating gate transistors M0, ..., Mn. The split program and program verify operations are done according to the order of activation of the associated global bit line select lines SLG[0] 467a and SLG[1] 467b. The P-type well TPW 244S selected sector 410S and the P-type well TPW 244U unselected sectors 410U are set to the voltage level of the ground reference voltage source (0.0V).

To establish the voltage levels as described for the read operation in FIGS. 13a and 13b, the source line decoder 415 has the voltage levels shown in FIG. 15. Referring to FIG. 15, the selected source line 426S is set to the voltage level of the ground reference voltage source (0.0V) and the unselected source lines 426SU and 426U are set to the source line read inhibit voltage VS1* that is approximately +1.0V.

Further, the selected block gate select line 433S and unselected block gate select lines 433U are to be set to the voltage level of the high source line select voltage HV" that is approximately +5.0V. To accomplish these voltage levels, the selected source line address line ST 620S for the selected source line 426S is set to the voltage level of the ground reference voltage source (0.0V) and the unselected source line address line ST 620U is set to the source line read inhibit voltage VS1*. The selected block source line selection signal SXD 610S is set to the voltage level of the power supply voltage source VDD and the unselected block source line selection signal SXD 610U is set to the voltage level of the ground reference voltage source (0.0V). The out of phase erase command signal ERSB 615 is set to the voltage level of the power supply voltage source VDD. The positive high voltage source VP2 616 and the out-of-phase program command signal PGB 619 are set to voltage level of the high source line select voltage HV" that is approximately +5.0V. The source line select line SLS 632 is set to the voltage level of the first read inhibit voltage VS1*. The source line erase isolation signal DISE 630 is set to the voltage level of the power supply voltage source VDD. The in phase program command signal PG 618 is set to approximately the voltage level of the ground reference voltage source (0.0V).

In other embodiments of this invention, nonvolatile memory device 400 incorporating NOR flash floating-gate transistors may have NAND flash floating gate transistor cells and be in keeping with the intent of this invention. Further, the description of the nonvolatile memory device 400 incorporating NOR flash floating-gate transistors may also be NOR or NAND flash charge trapping transistor formed with a charge trapping layer formed of a first layer of silicon dioxide, a layer of silicon nitride, and a second layer of silicon oxide commonly referred to as a SONOS charge trapping transistor.

While this invention has been particularly shown and described with reference to the preferred embodiments thereof, it will be understood by those skilled in the art that various changes in form and details may be made without departing from the spirit and scope of the invention.

The invention claimed is:

1. A nonvolatile memory device comprising:
  an array of nonvolatile memory cells arranged in rows and columns, such that the nonvolatile memory cells located on each column are connected to communicate with a local bit line associated with each column, the nonvolatile memory cells on each row are connected to communicate with a word line, and the nonvolatile memory cells on two adjacent rows are commonly connected to communicate with a source line, wherein the array of nonvolatile memory cells is partitioned into sectors, where each sector is placed in a first isolation well and each sector of the array of the nonvolatile memory cells is divided into blocks and each block is divided into pages, and each page includes one row of the nonvolatile memory cells; and a plurality of peripheral circuits comprising a row decoder comprising a plurality of voltage isolators wherein each voltage isolator is connected to the word lines associated with one block of the nonvolatile memory cells, wherein each voltage isolator is formed in a second isolation well such that when biasing voltages are applied to the first and second isolation wells for reading, programming, erasing, and verifying selected nonvolatile memory cells, the biasing voltages applied to the array of non-volatile memory cells do not exceed a drain to source breakdown voltage of the peripheral circuits.

2. The nonvolatile memory device of claim 1 wherein the peripheral circuit comprises a plurality of transistors, such that the drain to source breakdown voltage is no greater than 10.0V.

3. The nonvolatile memory device of claim 1 wherein the groups of nonvolatile memory cells are connected into a NOR configuration or a NAND configuration.

4. The nonvolatile memory device of claim 1 wherein the groups of nonvolatile memory cells comprise charge storing floating gate transistors or charge trapping SONOS transistors.

5. The nonvolatile memory device of claim 1 wherein each of the voltage isolators comprise a plurality of pass gates connected such that each pass gate transfers the operational signals to an associated word line for biasing control gates of charge retaining transistors of one row of the nonvolatile memory cells connected to the word line and the row decoder further comprises:
- a first block selector is connected to receive an address input and activates when a block address within the address input indicates that a block is selected,
- a word line selector circuit connected to the first block selector circuit, which based on a row address provides the word lines with word line operational voltage levels necessary for biasing the control gates of the charge retaining transistors of the nonvolatile memory cells for reading, programming, verifying, and erasing;
- a first voltage level shifter connected to the first block selector circuit for shifting a voltage level of a block select signal to activate pass gates to transfer the operational voltage levels to the word lines of the selected block for biasing the control gates of the charge retaining transistors of the nonvolatile memory cells of the block for reading, programming, verifying, and erasing the selected nonvolatile memory cells;
wherein the operational voltage levels of the word lines do not exceed the drain to source breakdown voltage level of the row decoder.

6. The nonvolatile memory device of claim 5 wherein the peripheral circuits further comprises:
- a source decoder circuit connected to each source line within each block to transfer necessary source line biasing voltages for reading, programming, verifying, and erasing selected nonvolatile memory cells wherein the source decoder comprises:
  - a second block selector circuit which activates for the selection of the block being addressed, and
  - a source voltage level shifter connected to the second block selector circuit to shift a voltage level of the block selector signals for activating pass transistors to transfer source line operational voltages to the source lines connected to the sources of the charge retaining transistors of the nonvolatile memory cells of the selected block for reading, programming, verifying, and erasing the selected nonvolatile memory cells,
wherein the operational voltage levels to the source lines do not exceed the drain to source breakdown voltage level of the source line decoder.

7. The nonvolatile memory device of claim 6 wherein the peripheral circuit further comprises:
- a column decoder in communication with a local bit line for providing biasing voltages for reading, programming, verifying, and erasing selected nonvolatile memory cells;
wherein the operational voltage levels to the local lines do not exceed the drain to source breakdown voltage level of the column decoder.

8. The nonvolatile memory device of claim 7 wherein the row decoder, source decoder, and column decoder provide inhibit biasing voltage levels to all the non-selected nonvolatile memory cells to minimize disturbances resulting from the reading, programming, verifying, and erasing selected nonvolatile memory cells.

9. The nonvolatile memory device of claim 8 wherein for reading a selected page of the array of nonvolatile memory cells,
- the row decoder transfers a voltage level of the power supply voltage source (VDD) to the word line of the selected nonvolatile memory cells for a single level program and a ground reference voltage level to the word lines of the word lines of the unselected nonvolatile memory cells;
- the column decoder transfers a first read biasing voltage to the drains of the selected nonvolatile memory cells; and
- the source decoder transfers the ground reference voltage level to the source lines of the selected nonvolatile memory cells and transfers a source line read inhibit voltage to the unselected source lines of the nonvolatile memory cells.

10. The nonvolatile memory device of claim 9 wherein the magnitude of the power supply voltage source is +1.8V or +3.0V.

11. The nonvolatile memory device of claim 9 wherein the voltage level of the first read biasing voltage is approximately the voltage level of the power supply voltage source less a threshold voltage of an NMOS transistor.

12. The nonvolatile memory device of claim 9 wherein the magnitude of the first read inhibit voltage is approximately +1.0V.

13. The nonvolatile memory device of claim 8 wherein for erasing a selected page of the array of nonvolatile memory cells,
- a very high negative erase voltage is applied to the first isolation well into which the sector of nonvolatile memory cells is formed;
- a very high positive erase voltage is applied to the second isolation well into which the pass gate of the word line for the selected page of nonvolatile memory cells is formed;
- the ground reference voltage level is applied to the second isolation wells into which the pass gates of the word lines for the unselected pages of nonvolatile memory cells is formed;
- the row decoder transfers the very high positive erase voltage to the word line of the nonvolatile memory cells of selected blocks, transfers the ground reference voltage level to the word lines of the unselected nonvolatile memory cells of the selected block, and disconnects the word lines of the nonvolatile memory cells of the unselected blocks so that the very high negative erase voltage is coupled from the first isolation well to the word lines of the unselected nonvolatile memory cells in unselected blocks;

the column decoder transfers the very high negative erase voltage to the selected and unselected bit lines; and the source line decoder transfers the very high negative erase voltage to the selected and unselected source lines.

14. The nonvolatile memory device of claim 13 wherein the voltage levels of the very high positive erase voltage and the very high negative erase voltage is less than or equal to the drain to source breakdown voltage level of approximately 10.0V for transistors forming the row decoder, column decoder, and the source line decoder.

15. The nonvolatile memory device of claim 14 wherein the magnitude of the very high positive erase voltage is from approximately +8.0V to approximately +10.0V and the magnitude of the very high negative erase voltage is from approximately −10.0V to approximately −8.0V.

16. The nonvolatile memory device of claim 8 wherein for verifying a page erase of a selected page of the array of nonvolatile memory cells, the row decoder of the selected page transfers a voltage level of a lower boundary of an erased threshold voltage level to the word line of the selected nonvolatile memory cells and transfers a ground reference voltage level to the word lines of the word lines of the unselected nonvolatile memory cells;

the column decoder transfers a second read biasing voltage to the drains of the selected nonvolatile memory cells; and the source line decoder transfers the ground reference voltage level to the source lines of the selected nonvolatile memory cells, and the second source line read inhibit voltage to the source lines of the unselected nonvolatile memory cells.

17. The nonvolatile memory device of claim 16 wherein the lower boundary of an erased threshold voltage level is approximately 6.0V for the single level cell program and a multiple level cell programming.

18. The nonvolatile memory device of claim 16 wherein the magnitude of the power supply voltage source is +1.8V or +2.3V.

19. The nonvolatile memory device of claim 16 wherein the magnitude of the second read biasing voltage is approximately the voltage level of the power supply voltage source less a threshold voltage of an NMOS transistor.

20. The nonvolatile memory device of claim 16 wherein the voltage level of the second source line read inhibit voltage is approximately +1.0V.

21. The nonvolatile memory device of claim 16 wherein the lower boundary of an erased threshold voltage level is approximately +6.0V.

22. The nonvolatile memory device of claim 8 wherein for erasing a selected block of the array of nonvolatile memory cells, a very high negative erase voltage is applied to the first isolation well;

a very high positive erase voltage is applied to the second isolation wells into which the pass gates of the word lines for the selected block of nonvolatile memory cells is formed;

the ground reference voltage level is applied to the second isolation wells into which the pass gates of the word lines for the unselected blocks of nonvolatile memory cells is formed;

the row decoder transfers a very high positive erase voltage to the word lines of the nonvolatile memory cells of the selected block and disconnect the word lines of the unselected nonvolatile memory cells of unselected blocks of nonvolatile so that the very high negative erase voltage is coupled from the first isolation well to the word lines of the unselected nonvolatile memory cells in unselected blocks;

the column decoder transfers the very high negative erase voltage to the selected and unselected bit lines; and the source line decoder transfers the very high negative erase voltage to the selected and unselected source lines.

23. The nonvolatile memory device of claim 22 wherein the magnitude of the very high positive erase voltage and the very high negative erase voltage is less than or equal to the drain to source breakdown voltage level of approximately 10.0V for transistors forming the row decoder, column decoder, and the source line decoder.

24. The nonvolatile memory device of claim 22 wherein the magnitude of the very high positive erase voltage is from approximately +8.0V to approximately +10.0V and the magnitude of the very high negative erase voltage is from approximately −10.0V to approximately −8.0V.

25. The nonvolatile memory device of claim 22 wherein for verifying a block erase, a selected page of the array of nonvolatile memory cells, the row decoder transfers a voltage level of a lower boundary of an erased threshold voltage level to the word line of the selected nonvolatile memory cells and the ground reference voltage level to the word lines of the word lines of the unselected nonvolatile memory cells;

the column decoder transfers the a third read biasing voltage to the bit lines connected to the selected nonvolatile memory cells; and the source decoder transfers the ground reference voltage level to the source lines of the selected nonvolatile memory cells, and a third source line read inhibit voltage to the source lines of the unselected nonvolatile memory cells.

26. The nonvolatile memory device of claim 25 wherein the lower boundary of an erased threshold voltage level is approximately 6.0V for the single level cell program and the multiple level cell programming.

27. The nonvolatile memory device of claim 22 wherein the magnitude level of the power supply voltage source is +1.8V or +3.0V.

28. The nonvolatile memory device of claim 22 wherein the voltage level of the second read biasing voltage is approximately the voltage level of the power supply voltage source less a threshold voltage of an NMOS transistor.

29. The nonvolatile memory device of claim 22 wherein the magnitude of the third source line read inhibit voltage is approximately +1.0V.

30. The nonvolatile memory device of claim 8 wherein for erasing a selected sector of the array of nonvolatile memory cells, a very high negative erase voltage is applied to the first isolation well into which the selected sector is formed;

a very high positive erase voltage is applied to the second isolation wells into which the pass gates of the word lines for the selected sector of nonvolatile memory cells is formed;

the ground reference voltage level is applied to the second isolation wells into which the pass gates of the word lines for the unselected sectors of nonvolatile memory cells is formed;

the row decoder transfers a very high positive erase voltage to the word lines of the nonvolatile memory cells of the selected sector;

the column decoder transfers the very high negative erase voltage to the selected and unselected bit lines; and the source decoder transfers the very high negative erase voltage to the selected and unselected source lines.

31. The nonvolatile memory device of claim 30 wherein the magnitude of the very high positive erase voltage and the very high negative erase voltage is less than or equal to the drain to source breakdown voltage level of approximately 10.0V for transistors forming the row decoder, column decoder, and the source line decoder.

32. The nonvolatile memory device of claim 30 wherein the magnitude of the very high positive erase voltage is from approximately +8.0V to approximately +10.0V and the magnitude of the very high negative erase voltage is from approximately −10.0V to approximately −8.0V.

33. The nonvolatile memory device of claim 8 wherein for verifying erasing a selected sector, the row decoder transfers the voltage level of a lower boundary of an erased threshold voltage level to the word line of the selected nonvolatile memory cells and a ground reference voltage level to the word lines of the word lines of the unselected nonvolatile memory cells;

the column decoder transfers a fourth read biasing voltage to the drains of the selected nonvolatile memory cells; and the source decoder transfers the ground reference voltage level to the source lines of the selected nonvolatile memory cells.

34. The nonvolatile memory device of claim 33 wherein The lower boundary of the erased threshold voltage level is approximately 6.0V for the single level cell program and the multiple level cell programming.

35. The nonvolatile memory device of claim 33 wherein the magnitude of the power supply voltage source is +1.8V or +3.0V.

36. The nonvolatile memory device of claim 33 wherein the magnitude of the fourth read biasing voltage is approximately the voltage level of the power supply voltage source less a threshold voltage of an NMOS transistor.

37. The nonvolatile memory device of claim 33 wherein the lower boundary of an erased threshold voltage level is approximately +6.0V.

38. The nonvolatile memory device of claim 8 wherein for programming a selected page of the array of nonvolatile memory cells the row decoder transfers a very high negative program voltage to the word line of the selected nonvolatile memory cells, and a positive program inhibit voltage to the word lines of the unselected word lines is the selected block and the unselected blocks of the array of nonvolatile memory cells;

the column decoder transfers a bit line program voltage to the bit lines of the selected nonvolatile memory cells and applies the ground reference voltage level to the bit lines connected to the unselected nonvolatile voltage cells; and the source line decoder transfers the ground reference voltage level to the source lines connected to the selected nonvolatile voltage cells and a source line program inhibit voltage to the source lines of the unselected nonvolatile memory cells.

39. The nonvolatile memory device of claim 38 wherein the magnitude of the very high negative program voltage is less than or equal to the drain to source breakdown voltage level of approximately 10.0V for transistors forming the row decoder.

40. The nonvolatile memory device of claim 38 wherein the magnitude of the high negative program voltage −10.0V to approximately −8.0V.

41. The nonvolatile memory device of claim 38 wherein the magnitude of the negative program inhibit voltage is approximately −2.0V.

42. The nonvolatile memory device of claim 38 wherein the bit line program select voltage is approximately +5.0V and the source line program inhibit voltage is from approximately 1.5V to approximately 1.8V.

43. The nonvolatile memory device of claim 8 wherein for verifying a page program, the row decoder transfers a voltage level of an upper boundary of a programmed threshold voltage level to the word line of the selected nonvolatile memory cells when the array of nonvolatile memory cells have a single level cell programming or iteratively set to a the upper boundaries of a first threshold voltage level, a second threshold voltage level and a third threshold voltage level, and the ground reference voltage level to the word lines of the word lines of the unselected nonvolatile memory cells;

the column decoder transfers a fifth read biasing voltage to the drains of the selected nonvolatile memory cells; and the source decoder transfers the ground reference voltage level to the source lines of the selected nonvolatile memory cells.

44. The nonvolatile memory device of claim 43 wherein the upper boundary of the programmed threshold voltage level is approximately +1.5V for the single level cell programming.

45. The nonvolatile memory device of claim 43 wherein the upper boundaries of a first threshold voltage level, a second threshold voltage level and a third threshold voltage level are respectively +1.5V, +3.0V, and +4.5V for the multiple level cell programming.

46. The nonvolatile memory device of claim 43 wherein the magnitude of the power supply voltage source is +1.8V or +3.0V.

47. The nonvolatile memory device of claim 43 wherein the voltage level of the fifth read biasing voltage is approximately the voltage level of the power supply voltage source less a threshold voltage of an NMOS transistor.

48. The nonvolatile memory device of claim 43 wherein the magnitude of the fifth source line read inhibit voltage is approximately +1.0V.

49. A method for operating an array of nonvolatile memory cells comprise the steps of:

erasing a selected page of the array of nonvolatile memory cells by the steps of:
applying a very high negative erase voltage to a first isolation well;
applying a very high positive erase voltage to the word line of the selected nonvolatile memory cells;
applying a ground reference voltage level to word lines of unselected nonvolatile memory cells of the selected block;
disconnecting the word lines of the unselected nonvolatile memory cells so that the very high negative erase voltage is coupled from the first isolation well to the word lines of the unselected nonvolatile memory cells in unselected blocks;

applying the very high negative erase voltage to selected and unselected source lines.

50. The method for operating an array of nonvolatile memory cells of claim 49 wherein the magnitude of the very high positive erase voltage and the very high negative erase voltage are less than or equal to the drain to source breakdown voltage level of approximately 10.0V for transistors forming the row decoder, column decoder, and the source line decoder.

51. The method for operating an array of nonvolatile memory cells of claim 49 wherein the magnitude of the very high positive erase voltage is from approximately +8.0V to approximately +10.0V and the magnitude of the very high negative erase voltage is −10.0V to approximately −8.0V.

52. The method for operating an array of nonvolatile memory cells of claim 49 further comprising the steps of:
reading a selected page of the array of nonvolatile memory cells by the steps of:
applying a voltage level of the power supply voltage source (VDD) to the word line of the selected nonvolatile memory cells when the array of nonvolatile memory cells are programmed with a single level program or applying an intermediate read voltage level to the word line of the selected nonvolatile memory cells when the array of nonvolatile memory cells are programmed with a multiple level program,
applying the ground reference voltage level to the word lines of the word lines of the unselected nonvolatile memory cells,
applying a first read biasing voltage to the drains of the selected nonvolatile memory cells,
applying the ground reference voltage level the source lines of the selected nonvolatile memory cells, and
applying a first source line read inhibit voltage to the source lines of the nonvolatile memory cells.

53. The method for operating an array of nonvolatile memory cells of claim 52 wherein the magnitude of the power supply voltage source is +1.8V or +3.0V.

54. The method for operating an array of nonvolatile memory cells of claim 52 wherein the magnitude of the first read biasing voltage is approximately +5.0V.

55. The method for operating an array of nonvolatile memory cells of claim 52 wherein the magnitude of the first read inhibit voltage is approximately +1.0V.

56. The method for operating an array of nonvolatile memory cells of claim 49 further comprising the step of:
verifying a page erase of a selected page of the array of nonvolatile memory cells by the steps of:
applying a voltage level of a lower boundary of an erased threshold voltage level to the word line of the selected nonvolatile memory cells;
applying the ground reference voltage level to the word lines of the word lines of the unselected nonvolatile memory cells;
applying a second read biasing voltage to the drains of the selected nonvolatile memory cells;
applying the ground reference voltage level to the source lines of the selected nonvolatile memory cells; and
applying a second source line first read inhibit voltage to the source lines of the unselected nonvolatile memory cells.

57. The method for operating an array of nonvolatile memory cells of claim 56 wherein the lower boundary of an erased threshold voltage level is approximately 6.0V for the single level cell program and the multiple level cell programming.

58. The method for operating an array of nonvolatile memory cells of claim 56 wherein the voltage level magnitude of the power supply voltage source is +1.8V or +2.3V.

59. The method for operating an array of nonvolatile memory cells of claim 58 wherein the magnitude of the second source line read inhibit voltage is approximately the voltage level of the power supply voltage source less a threshold voltage of an NMOS transistor.

60. The method for operating an array of nonvolatile memory cells of claim 49 further comprising the step of:
the step of erasing a selected block of the array of nonvolatile memory cells by the steps of:
applying the very high negative erase voltage is applied to the first isolation well;
applying a very high positive erase voltage to the word lines of the nonvolatile memory cells of the selected block;
disconnecting the word lines of the unselected nonvolatile memory cells so that the very high negative erase voltage is coupled from the first isolation well to the word lines of the unselected nonvolatile memory cells in unselected blocks; and
applying the very high negative erase voltage to the selected and unselected source lines.

61. The method for operating an array of nonvolatile memory cells of claim 60 wherein the magnitude of the very high positive erase voltage and the very high negative erase voltage is less than or equal to the drain to source breakdown voltage level of approximately 10.0V for transistors forming the row decoder, column decoder, and the source line decoder.

62. The method for operating an array of nonvolatile memory cells of claim 60 wherein the magnitude of the very high positive erase voltage is from approximately +8.0V to approximately +10.0V.

63. The method for operating an array of nonvolatile memory cells of claim 60 wherein the magnitude of the very high negative erase voltage is from approximately −10.0V to approximately −8.0V.

64. The method for operating an array of nonvolatile memory cells of claim 49 further comprising the step of:
verifying a block erase of a selected block of the array of nonvolatile memory cells by the steps of:
applying a voltage level of a lower boundary of an erased threshold voltage level to the word line of the selected nonvolatile memory cells;
applying the ground reference voltage level to the word lines of the word lines of the unselected nonvolatile memory cells;
applying a third read biasing voltage to the drains of the selected nonvolatile memory cells;
applying the ground reference voltage level to the source lines of the selected nonvolatile memory cells; and
applying a third source line read inhibit voltage to the source lines of the unselected nonvolatile memory cells.

65. The method for operating an array of nonvolatile memory cells of claim 64 wherein the lower boundary of an erased threshold voltage level is approximately 6.0V for the single level cell program and the multiple level cell programming.

66. The method for operating an array of nonvolatile memory cells of claim 64 wherein the voltage level of the power supply voltage source is +1.8V or +3.0V.

67. The method for operating an array of nonvolatile memory cells of claim 66 wherein the magnitude of the third read biasing voltage is approximately the voltage level of the power supply voltage source less a threshold voltage of an NMOS transistor.

68. The method for operating an array of nonvolatile memory cells of claim 64 wherein the magnitude of the third source line read inhibit voltage is approximately +1.0V.

69. The method for operating an array of nonvolatile memory cells of claim 49 further comprising the step of:
   erasing a selected sector of the array of nonvolatile memory cells by the steps of:
      applying the very high negative erase voltage to the first isolation well;
      applying the very high positive erase voltage to the word lines of the nonvolatile memory cells of the selected sector; and
      applying the very high negative erase voltage to the selected and unselected source lines.

70. The method for operating an array of nonvolatile memory cells of claim 49 wherein the magnitude of the very high positive erase voltage and the very high negative erase voltage is less than or equal to the drain to source breakdown voltage level of approximately 10.0V for transistors forming the row decoder, column decoder, and the source line decoder.

71. The method for operating an array of nonvolatile memory cells of claim 49 wherein the magnitude of the very high positive erase voltage is from approximately +8.0V to approximately +10.0V.

72. The method for operating an array of nonvolatile memory cells of claim 49 wherein the magnitude of the very high negative erase voltage is from approximately −10.0V to approximately −8.0V.

73. The method for operating an array of nonvolatile memory cells of claim 49 further comprising the step of:
   verifying erasing a sector of the array of nonvolatile memory cells by the steps of:
      applying a voltage level of a lower boundary of an erased threshold voltage level to the word line of the selected nonvolatile memory cells;
      applying the fourth read biasing voltage to the drains of the selected nonvolatile memory cells; and
      applying the ground reference voltage level to the source lines of the selected nonvolatile memory cells.

74. The method for operating an array of nonvolatile memory cells of claim 73 wherein the lower boundary of an erased threshold voltage level is approximately 6.0V for the single level cell program and the multiple level cell programming.

75. The method for operating an array of nonvolatile memory cells of claim 73 wherein the voltage level magnitude of the power supply voltage source is +1.8V or +3.0V.

76. The method for operating an array of nonvolatile memory cells of claim 75 wherein the magnitude of the fourth read biasing voltage is approximately the voltage level of the power supply voltage source less a threshold voltage of an NMOS transistor.

77. The method for operating an array of nonvolatile memory cells of claim 49 further comprising the step of;
   programming a selected page of the array of nonvolatile memory cells by the steps of;
      applying a very high negative program voltage to the word line of the selected page of nonvolatile memory cells;
      applying a negative program inhibit voltage to the word lines of the unselected word lines in the selected block and the unselected blocks of the array of nonvolatile memory cells;
      applying a bit line program voltage to the bit lines and thus to the drains of the selected nonvolatile memory cells;
      applying the ground reference voltage level to the bit lines connected to the drains of the unselected nonvolatile voltage cells;
      applying the ground reference voltage level to the source lines connected to the selected nonvolatile voltage cells; and
      applying a source line program inhibit voltage to the source lines of the unselected nonvolatile memory cells.

78. The method for operating an array of nonvolatile memory cells of claim 77 wherein the magnitude of the very high negative program voltage is less than or equal to the drain to source breakdown voltage level of approximately 10.0V for transistors forming the row decoder.

79. The method for operating an array of nonvolatile memory cells of claim 77 wherein the magnitude of the high negative program voltage is from approximately −10.0V to approximately −8.0V.

80. The method for operating an array of nonvolatile memory cells of claim 77 wherein the magnitude of the negative program inhibit voltage is approximately −2.0V.

81. The method for operating an array of nonvolatile memory cells of claim 77 wherein the bit line program select voltage is approximately +5.0V.

82. The method for operating an array of nonvolatile memory cells of claim 77 wherein the source line program inhibit voltage is from approximately 1.5V to approximately 1.8V.

83. The method for operating an array of nonvolatile memory cells of claim 49 further comprising the step of;
   verifying a page program of a selected page of the array of nonvolatile memory cells by the steps of:
      applying the voltage level of an upper boundary of a programmed threshold voltage level to the word line of the selected nonvolatile memory cells when the array of nonvolatile memory cells are programmed with a single level cell programming or iteratively applying the upper boundaries of a first threshold voltage level a second threshold voltage level and a third threshold voltage level to the word line of the selected nonvolatile memory cells when the array of nonvolatile memory cells are programmed with a multiple level cell programming;
      applying the ground reference voltage level to the word lines of the word lines of the unselected nonvolatile memory cells;
      applying a fifth read biasing voltage to the drains of the selected nonvolatile memory cells;
      applying the ground reference voltage level to the source lines of the selected nonvolatile memory cells; and
      applying a fifth source line read inhibit voltage to the source lines of the unselected nonvolatile memory cells when the array of nonvolatile memory cells are programmed with a single level cell programming.

84. The method for operating an array of nonvolatile memory cells of claim 83 wherein the upper boundary of a programmed threshold voltage level is approximately +1.5V for the single level cell programming.

85. The method for operating an array of nonvolatile memory cells of claim 83 wherein the upper boundaries of a first threshold voltage level, a second threshold voltage level and a third threshold voltage level are respectively +1.5V, +3.0V, and +4.5V for the multiple level cell programming.

86. The method for operating an array of nonvolatile memory cells of claim 83 wherein the voltage level magnitude of the power supply voltage source is +1.8V or +3.0V.

87. The method for operating an array of nonvolatile memory cells of claim 83 wherein the voltage level of the fifth source line read inhibit voltage is approximately 1.0V.

88. The method for operating an array of nonvolatile memory cells of claim 86 wherein the magnitude of the fifth read biasing voltage is approximately the voltage level of the power supply voltage source less a threshold voltage of an NMOS transistor.

89. The method for operating an array of nonvolatile memory cells of claim 49 further comprising the steps of:
applying the very high positive erase voltage to a second isolation well into which a pass gate of the word line for the selected page of nonvolatile memory cells is formed; and
applying the ground reference voltage level to the second isolation wells into each of which the pass gates of the word lines for the unselected pages of nonvolatile memory cells are formed.

90. The method for operating an array of nonvolatile memory cells of claim 60 wherein the step of erasing a selected blocks of the array of nonvolatile memory cells further comprising the steps of:
applying the very high positive erase voltage to second isolation well into which pass gates of each of the word lines for the selected block of nonvolatile memory cells are formed; and
applying the ground reference voltage level to the second isolation wells into which the pass gates of the word lines for the unselected blocks of nonvolatile memory cells are formed.

91. The method for operating an array of nonvolatile memory cells of claim 69 wherein the step of erasing a selected sector of the array of nonvolatile memory cells further comprising the step of:
applying the very high positive erase voltage to a plurality of second isolation wells into which pass gates of each of the word lines for the selected sector of nonvolatile memory cells are formed.

92. The method for operating an array of nonvolatile memory cells of claim 38 wherein the bit line program voltage is approximately +4.0V, +5.0V, +6.0V, or the ground reference voltage level dependent on the data being programmed when the array of nonvolatile memory cells are multiple level programmed.

93. The method for operating an array of nonvolatile memory cells of claim 77 wherein the bit line program voltage is approximately +4.0V, +5.0V, +6.0V, or the ground reference voltage level dependent on the data being programmed when the array of nonvolatile memory cells are multiple level programmed.

* * * * *